(12) United States Patent
Yoshida

(10) Patent No.: US 11,201,175 B2
(45) Date of Patent: Dec. 14, 2021

(54) ARRAY SUBSTRATE WITH CAPACITANCE FORMING PORTION TO HOLD POTENTIAL AT ELECTRODE

(71) Applicant: Sharp Kabushiki Kaisha, Sakai (JP)

(72) Inventor: Masahiro Yoshida, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 199 days.

(21) Appl. No.: 16/686,293

(22) Filed: Nov. 18, 2019

(65) Prior Publication Data

US 2020/0161338 A1    May 21, 2020

Related U.S. Application Data

(60) Provisional application No. 62/770,211, filed on Nov. 21, 2018.

(51) Int. Cl.
| | |
|---|---|
| *H01L 29/12* | (2006.01) |
| *H01L 27/12* | (2006.01) |
| *H01L 29/786* | (2006.01) |
| *G02F 1/1368* | (2006.01) |
| *G02F 1/1362* | (2006.01) |
| *G02F 1/1335* | (2006.01) |

(52) U.S. Cl.
CPC .......... *H01L 27/124* (2013.01); *G02F 1/1368* (2013.01); *G02F 1/133514* (2013.01); *G02F 1/136209* (2013.01); *G02F 1/136286* (2013.01); *H01L 27/1225* (2013.01); *H01L 27/1255* (2013.01); *H01L 29/7869* (2013.01); *H01L 29/78633* (2013.01); *G02F 2201/40* (2013.01)

(58) Field of Classification Search
CPC .............. H01L 27/124; H01L 27/1255; H01L 29/78633; H01L 27/1225; G02F 1/1368; G02F 1/136286
See application file for complete search history.

(56) References Cited

U.S. PATENT DOCUMENTS

| | | | |
|---|---|---|---|
| 6,172,728 B1* | 1/2001 | Hiraishi ............ | G02F 1/136286 349/139 |
| 8,885,128 B2* | 11/2014 | Kwack ................ | H01L 27/1248 349/138 |
| 9,488,881 B2* | 11/2016 | Jiang .................. | G02F 1/134309 |
| 9,640,122 B2* | 5/2017 | Ono ...................... | G02F 1/1362 |

(Continued)

FOREIGN PATENT DOCUMENTS

WO    2013/021607 A1    2/2013

*Primary Examiner* — Caleb E Henry
(74) *Attorney, Agent, or Firm* — Keating & Bennett, LLP

(57) ABSTRACT

An array substrate includes at least one electrode, at least one first capacitance forming portion, at least one electrode connecting portion, and at least one second capacitance forming portion. The first capacitance forming portion is disposed to overlap the electrode via an insulator. The electrode connecting portion is connected to the electrode and disposed between the electrode and the first capacitance forming portion to overlap the electrode and the first capacitance forming portion via insulators, respectively. The second capacitance forming portion is connected to the first capacitance forming portion and disposed between the electrode and the electrode connecting portion to overlap the electrode and the electrode connecting portion via insulators, respectively.

16 Claims, 15 Drawing Sheets

(56) References Cited

U.S. PATENT DOCUMENTS

| | | | |
|---|---|---|---|
| 9,666,608 B2* | 5/2017 | Hoka | H01L 27/124 |
| 2002/0021374 A1* | 2/2002 | Kikkawa | G02F 1/136227 |
| | | | 349/38 |
| 2004/0174483 A1* | 9/2004 | Nakamura | G02F 1/136213 |
| | | | 349/139 |
| 2008/0316385 A1* | 12/2008 | Matsumura | G02F 1/136213 |
| | | | 349/39 |
| 2011/0085121 A1* | 4/2011 | Jeon | H01L 27/0207 |
| | | | 349/141 |
| 2014/0176845 A1 | 6/2014 | Uchida et al. | |

* cited by examiner

ARRAY SUBSTRATE WITH CAPACITANCE FORMING PORTION TO HOLD POTENTIAL AT ELECTRODE

CROSS REFERENCE TO RELATED APPLICATION

This application claims priority from Provisional Patent Application No. 62/770,211 filed on Nov. 21, 2018. The entire contents of the priority application are incorporated herein by reference.

TECHNICAL FIELD

The technology described herein relates to an array substrate and a display device.

BACKGROUND ART

An example of a liquid crystal display device is described in International Publication WO 2013/021607. The liquid crystal display device includes gate lines, source lines, pixel electrodes, transparent auxiliary capacitance electrodes, and switching components. The gate lines and the source lines are arranged in a grid. The pixel electrodes are arranged in a matrix to be at intersections of the gate lines and the source lines. The switching components are configured to apply voltages to the source lines according to scan signals transmitted from the gate lines. The switching components are prepared from an oxide semiconductor layer. The transparent auxiliary capacitance electrodes are disposed between the source lines and the pixel electrodes.

According to the liquid crystal display device, crosstalk between the pixel electrodes and source lines can be reduced and thus flickers can be reduced. Potentials at the pixel electrodes are held with capacitances formed between the pixel electrodes and the transparent auxiliary capacitance electrodes. The transparent auxiliary capacitance electrodes are made of a transparent electrode material. In comparison to a metal film, sheet resistances of the transparent auxiliary capacitance electrodes are higher. As the liquid crystal display device is increased in size, standard deviation in distribution regarding resistances of the transparent auxiliary capacitance electrodes may increase. To avoid such a problem, the auxiliary capacitance electrodes may be prepared from a metal film having a lower sheet resistance. However, the metal film does not transmit light and thud areas of the pixels in which the auxiliary capacitance electrodes are limited so that an aperture ratio of the pixels does not decrease. If the areas are limited, the capacitances between the pixel electrodes and the auxiliary capacitance electrodes decrease resulting in instability in potential at the pixel electrodes. This may cause display defects such as flickering or shadowing. Furthermore, overlapping areas of the transparent auxiliary capacitance electrodes relative to the source lines are large. Therefore, influence of signal corruption at the source lines or the transparent auxiliary capacitance electrodes tends to increase. This may cause display defects such as shadowing.

SUMMARY

The technology described herein was made in view of the above circumstances. An object is to stably hold potentials at electrodes.

An array substrate includes at least one electrodes, at least one first capacitance forming portion, at least one electrode connecting portion, and at least one second capacitance forming portion. The at least one first capacitance forming portion is disposed to overlap the at least one electrode via an insulator. The at least one electrode connecting portion is connected to the at least one electrode and disposed between the at least one electrode and the at least one first capacitance forming portion to overlap the at least one electrode and the at least one first capacitance forming portion via insulators, respectively. The at least one second capacitance forming portion connected to the at least one first capacitance forming portion and disposed between the at least one electrode and the at least one electrode connecting portion to overlap the at least one electrode and the at least one electrode connecting portion via insulators, respectively.

A display device includes the array substrate described above and an opposed substrate opposed to the array substrate.

According to the technology described herein, potentials at electrodes can be stably held.

DETAILED DESCRIPTION

First Embodiment

Figure 1:
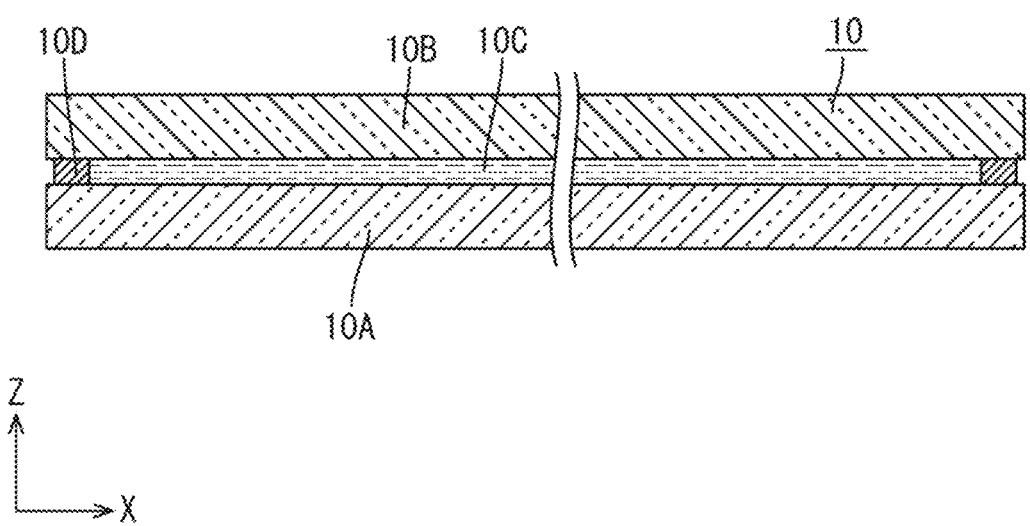
FIG. 1 is a cross-sectional view of a liquid crystal panel according to a first embodiment.

A first embodiment will be described in detail with reference to FIGS. 1 to 9. In this section, an array substrate 10A included in a liquid crystal panel 10 (a display panel) will be described. In the drawings, X-axes, Y-axes, and Z-axes may be present. The axes in each drawing correspond to the respective axes in other drawings. Upper sides and lower sides of FIGS. 4, 8 and 9 correspond to the front side and the rear side of the liquid crystal panel 10.

FIG. 1 is a cross-sectional view schematically illustrating the liquid crystal panel 10. As illustrated in FIG. 1, the liquid crystal panel 10 includes the array substrate 10A, a CF substrate 10B (an opposed substrate), a liquid crystal layer 10C, and a sealant 10D. The CF substrate 10B is opposed to the array substrate 10A. The liquid crystal layer 10C is disposed between the substrates 10A and 10B. The sealant 10D surrounds the liquid crystal layer 10C and seals the liquid crystal layer 10C. In this embodiment, a liquid crystal material included in the liquid crystal layer 10C is a negative liquid crystal material having negative dielectric constant anisotropy. Polarizing plates are bonded to outer surfaces of the substrates 10A and 10B, respectively. The liquid crystal panel 10 according to this embodiment may have a screen size of about 60 inches (e.g., 62.4 inches) or about 30 inches (e.g., 31.2 inches) with a resolution of "7680×4320" corresponding to an 8K resolution or a resolution of "3840×2160" corresponding to a 4K resolution.

Figure 2:
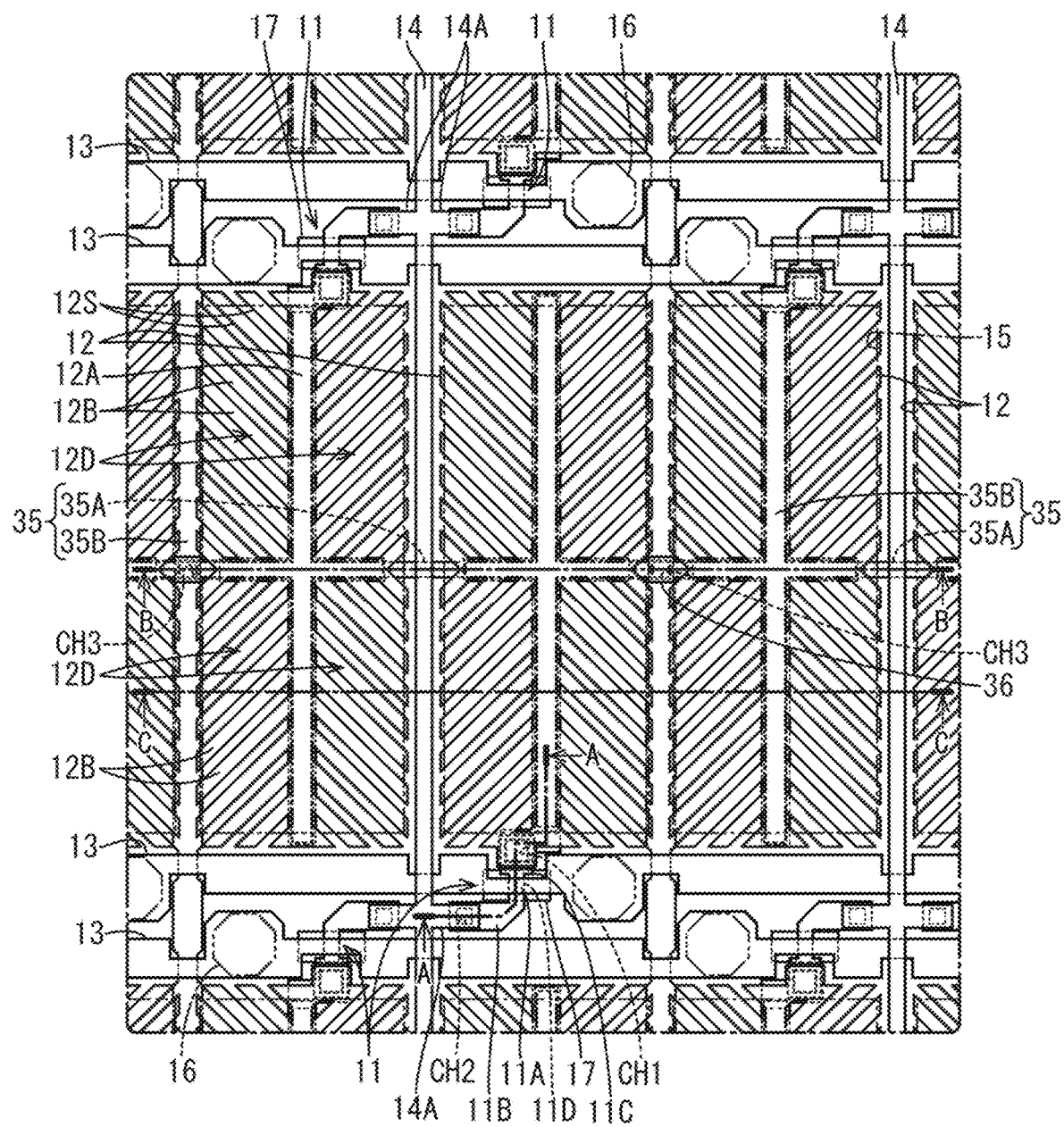
FIG. 2 is a plan view illustrating arrangement of pixels in an array substrate included in the liquid crystal panel.
Figure 2:
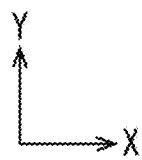

The liquid crystal panel 10 includes a display area in which images can be displayed and a non-display area surrounding the display area. FIG. 2 is a plan view illustrating a section of the array substrate 10A in the display area. FIG. 2 includes a section of the CF substrate 10B. As illustrated in FIG. 2, TFTs 11 (switching components, thin film transistors) are arranged in a matrix. Furthermore, pixel electrodes 12 (electrodes) connected to the TFTs 11 are arranged along the X-axis direction (a first direction) and a Y-axis direction (a second direction) in a matrix. Gate lines 13 (first lines, scanning lines) and source lines 14 (second lines, lines, data lines) are routed in a grid to surround the TFTs 11 and the pixel electrodes 12. The TFTs 11 include at least gate electrodes 11A, source regions 11B, and drain regions 11C. The gate electrodes 11A are connected to the gate lines 13. The source regions 11B are connected to the source lines 14. The drain regions 11C are connected to the pixel electrodes 12. The TFTs 11 turn on based on scanning signals supplied through the gate lines 13 and image signals (data signals) transmitted through the source lines 14 are supplied to the pixel electrodes 12 to charge the pixel electrodes 12 to potentials based on the image signals.

As illustrated in FIG. 2, the gate lines 13 extend substantially along the X-axis direction and the source lines 14 extend substantially along the Y-axis direction. The lines 13 and 14 are perpendicular to (crossing) each other. The gate lines 13 are disposed such that two gate lines 13 are consecutively arranged every two pixel electrodes 12 that are adjacent to each other in the Y-axis direction. Therefore, the number of the gate lines 13 is double of the number of lines of the pixel electrodes 12 in the Y-axis direction. The source lines 14 are arranged at intervals such that two pixel electrodes 12 are sandwiched between two source lines 14 in the X-axis direction. Therefore, the number of the source lines 14 is a half of the number of lines of the pixel electrodes 12 in the X-axis direction. The TFTs 11 include the TFT 11 that is connected to one of the two adjacent gate lines 13 (e.g., the gate line 13 on the upper side in FIG. 2) and the pixel electrode 12 adjacent to the gate line 13 and the TFT 11 that is connected to the other one of the two adjacent gate lines 13 (e.g., the gate line 13 on the lower side in FIG. 2) and the pixel electrode 12 adjacent to the gate line 13. The TFTs 11 are connected to the same source line 14. The pixel electrode 12 connected to one of the TFTs 11 is adjacent to the source line 14 on a first side with respect to the X-axis direction (e.g., on the right in FIG. 2). The pixel electrode 12 connected to the other one of the TFTs 11 is adjacent to the source line 14 on a second side with respect to the X-axis direction (e.g., on the left in FIG. 2). Namely, each of two TFTs 11 is connected to one source line 14, one of two pixel electrodes 12, and one of two gate lines 13. The two pixel electrodes 12 are disposed diagonally opposite to each other with the source line 14 therebetween. The two gate lines 13 are sandwiched between the two pixel electrodes 12. The TFTs 11 are two-dimensionally arranged in zigzags such that two adjacent TFTs 11 are diagonally opposite to each other with the source line 14 therebetween. According to the configuration, image signals supplied to each of the source lines 14 are supplied to two pixel electrodes 12 that are diagonally opposite to each other with the source line 14 therebetween via two TFTs 11 that are connected to the different gate lines 13. Because scanning signals are supplied to two gate lines 13 that are sandwiched between two pixel electrodes 12 at different timings, the pixel electrodes 12 arranged in the X-axis direction and pixel electrodes 12 arranged in Y-axis direction can be charged to different potentials. In comparison to a configuration in which source lines and pixel electrodes are alternately arranged, the number of the source lines 14 is reduced in half and the number of circuits (or a size of a circuit) for driving the source lines 14 can be reduced. This configuration is preferable for reducing a width of a bezel and a production cost of the liquid crystal panel 10.

As illustrated in FIG. 2, each of the pixel electrodes 12 is disposed in a vertically-long rectangular area. The pixel electrodes 12 include trunk electrode portions 12A and branch electrode portions 12B coupled to the trunk electrode portions 12A. An overall shape of each of the pixel electrodes 12 in a plan view is a fishbone shape. Each trunk electrode portion 12A has a cross shape in the plan view. The trunk electrode portions 12A include sections that extend in the X-axis direction and sections that extend in the Y-axis direction. The branch electrode portions 12B are disposed in four regions divided by the trunk electrode portions 12A having the cross shape. Multiple branch electrode portions 12B are disposed in each region. One of ends of each branch electrode portion 12B is coupled to the trunk electrode portion 12A. The branch electrode portions 12B radially spread from the center of the trunk electrode portion 12A. The branch electrode portions 12B disposed in the regions adjacent to one another in the X-axis direction and the Y-axis direction extend in directions that cross each other. The branch electrode portions 12B are arranged at about equal intervals in each region. Slits 12S are provided between the adjacent branch electrode portions 12B. Each slit 12S has a substantially constant width. The slits 12S extend in the directions in which the branch electrode portions 12B extend and radially spread from the center of the trunk electrode portion 12A in each region. Namely, each of the pixel electrodes 12 includes four domains 12D. The direction in which the slits 12S extend in one domain 12D is different from the direction in which the slits 12S extend in other domain 12D. Two domains 12D of the pixel electrode 12 are arranged in the X-axis direction and two domains 12D of the pixel electrode 12 are arranged in the Y-axis direction. The trunk electrode portion 12A of each of the pixel electrodes 12 defines borders of four domains 12D. Each of the domains 12D has a vertically-long rectangular shape in the plan view. Recesses are formed in sections of the surface of the array substrate 10A overlapping the slits 12S (sections in which the pixel electrodes 12 are not disposed). Electric fields are created according to shapes of the recesses and thus the liquid crystal molecules in the liquid crystal layer 10C are oriented along the recesses. The orientations of the liquid crystal molecules in the liquid crystal layer 10C are different from region to region. Namely, the liquid crystal panel 10 according to this embodiment operates in multi-domain vertical alignment (MVA) mode to obtain a wide viewing angle. The CF substrate 10B includes a black matrix 15 (an inter-pixel light blocking portion) including holes in sections overlapping the pixel electrodes 12. The black matrix 15 is disposed to overlap the TFTs 11, the gate lines 13, and the source lines 14. The CF substrate 10B includes spacers 16 for maintaining a thickness of the liquid crystal layer 10C (a cell gap). The spacers 16 are two-dimensionally arranged to overlap sections of the gate lines 13.

Figure 3:
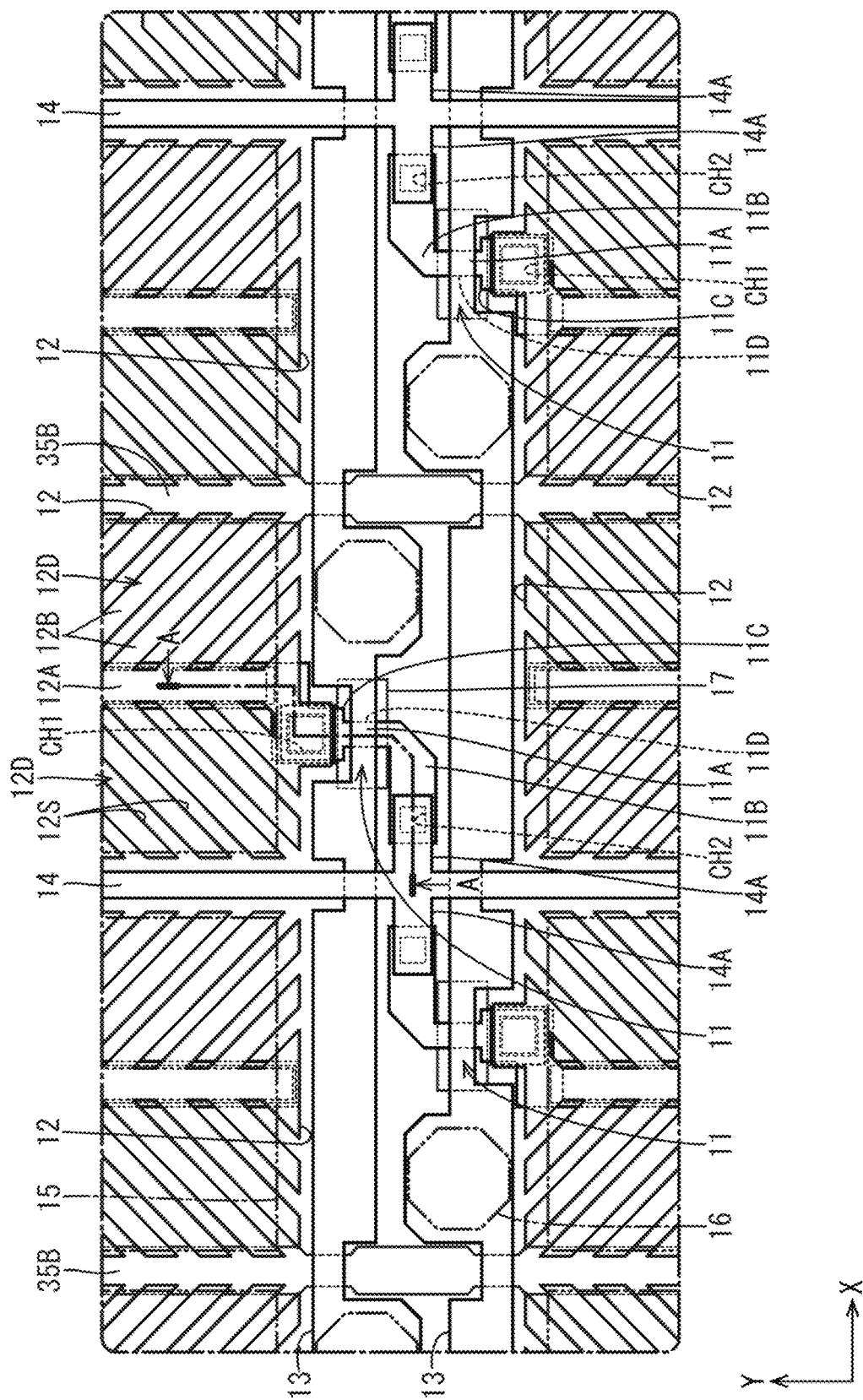
FIG. 3 is a magnified plan view illustrating a portion of the array substrate including a TFT and therearound.

FIG. 3 is a plan view illustrating a portion of the array substrate 10A including the TFT 11 and therearound. The configuration of the TFT 11 will be described in detail with reference to FIG. 3. As illustrated in FIG. 3, each of the TFTs 11 is disposed adjacent to the pixel electrode 12 to which the TFT 11 is connected and below or above the pixel electrode 12 with respect to the Y-axis direction in FIG. 3. The TFTs 11 include the gate electrodes 11A that are sections of the gate lines 13. Each gate line 13 includes sections having widths that are different from each other at positions in the X-axis direction. The width of the sections configured as the gate electrodes 11A (sections crossing channel regions 11D) is the smallest. The TFTs 11 include the source regions 11B connected to the source lines 14. Each source line 14 includes source line branches 14A that branch off from sections of the source line 14 between two consecutive gate lines 13. Two source line branches 14A branch off from each section of the source line 14. The two source line branches 14A that branch off from each section of the source line 14 extend to the right and the left, respectively, along the X-axis direction. Ends of the source line branches 14A are connected to the source regions 11B. The TFTs 11 include the drain regions 11C disposed with distances from the source regions 11B in the Y-axis direction. The drain regions 11C include ends on an opposite side from the source regions 11B (the channel region 11D) connected to the pixel electrodes 12. The TFTs 11 include the channel regions 11D overlapping the gate electrodes 11A and being coupled to the source regions 11B and the drain regions 11C. The channel regions 11D extend in the Y-axis direction. First ends and second ends of the channel regions 11D are connected to the source regions 11B and the drain regions 11C, respectively. When the TFTs 11 turn on based on scanning signals supplied to the gate electrodes 11A, image signals (potentials) supplied to the source lines 14 are transmitted to the drain regions 11C via the source regions 11B and the channel regions 11D. As a result, the pixel electrodes 12 are charged to potentials based on the image signals. Light blocking portions 17 are disposed on the rear side of the channel regions 11D of the TFT having the configuration described above with respect to the Z-axis direction, that is, on an opposite side from the gate electrodes 11A to overlap the channel regions 11D. Each light blocking portion 17 has a horizontally-long rectangular shape in a plan view to extend in the X-axis direction. The light blocking portions 17 form island shapes. The light blocking portions 17 block light toward the channel regions 11D from the rear side. The light may be applied to the liquid crystal panel 10 by a backlight unit for image display. By blocking the light toward the channel regions 11D with the light blocking portions 17, variations in characteristics of the TFTs 11, which may occur when the channel regions 11D are subjected to the light, are less likely to occur.

Figure 4:
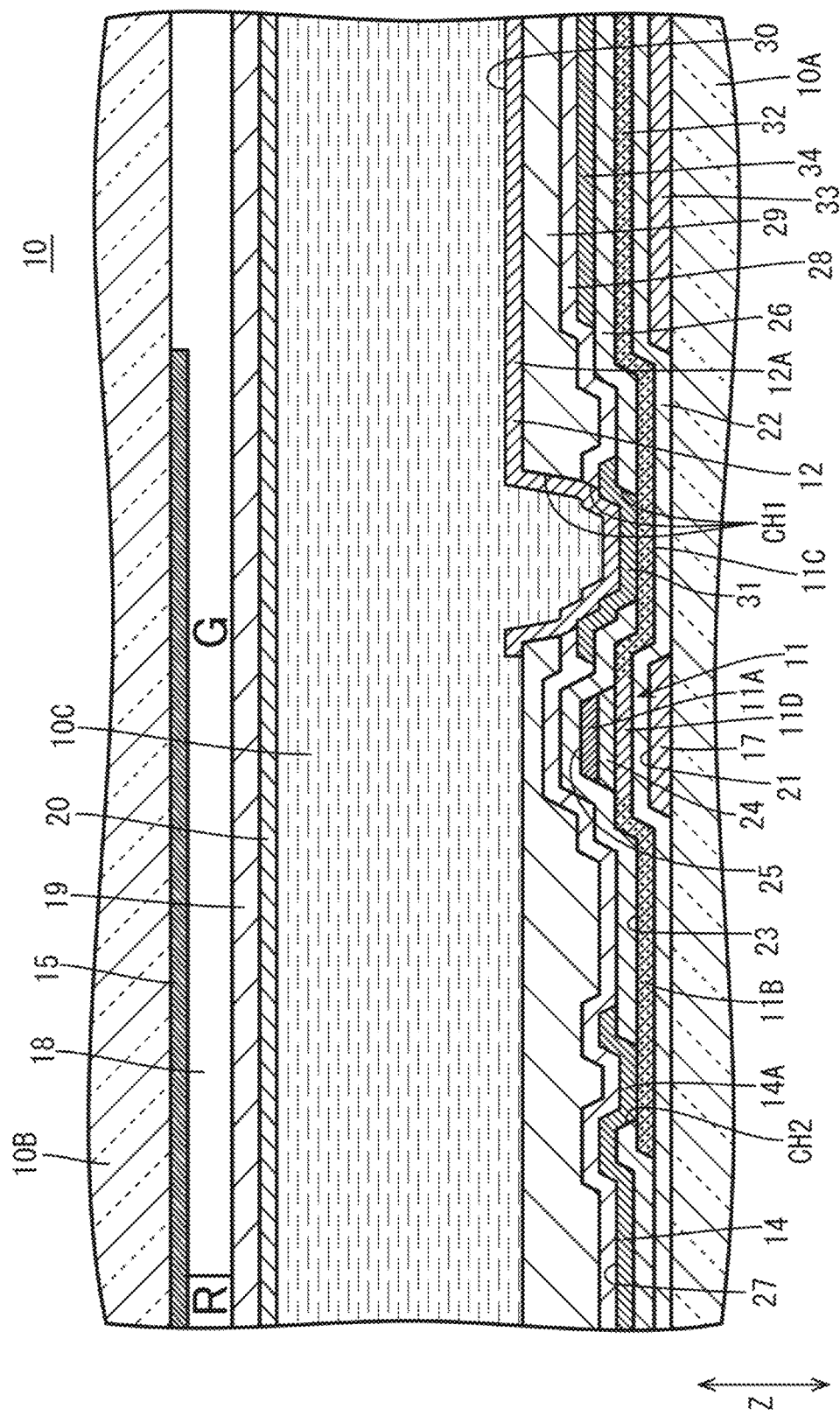
FIG. 4 is a cross-section view of the liquid crystal panel along line A-A in FIGS. 2 and 3.

FIG. 4 is a cross-sectional view of the liquid crystal panel 10 along line A-A in FIGS. 2 and 3. As illustrated in FIG. 4, a large number of color filters 18 are disposed at positions opposed to the pixel electrodes 12 in the array substrate 10A to form a matrix in an area of the CF substrate 10B in the display area. The color filters 18 include red (R), green (G), and blue (B) filters that are arranged in predefined sequence to form pixels, which are display units, together with the pixel electrodes 12 opposed thereto. In this embodiment, an arrangement pitch of the pixels in the X-axis direction is about 60 μm and an arrangement pitch of the pixels in the Y-axis direction is about 180 μm. The black matrix 15 described earlier is disposed between the adjacent color filter to reduce color mixture. An overcoat film 19 is formed on an inner surface side of the color filters 18 for planarization. A common electrode 20 is disposed on an inner surface of the overcoat film 19. The common electrode 20 is formed in a solid pattern at least in the display area and opposed to all pixel electrodes 12 via the liquid crystal layer 10C. When a reference potential (a common potential) is supplied to the common electrode 20, potential differences are created between the common electrode 20 and the pixel electrodes 12 that are charged by the TFTs 11. Orientation of the liquid crystal molecules in the liquid crystal layer 10C varies according to the potential differences. According to the configuration, predefined grayscale control can be performed for each pixel. The spacers 16 described earlier are formed on an inner surface side of the common electrode 20 (see FIGS. 2 and 3). The spacers 16 protrude from the inner surface of the CF substrate 10B in the Z-axis direction toward the array substrate 10A. Ends of the spacers 16 are disposed to contact or adjacent to the innermost surface of the array substrate 10A. Alignment films are formed on the innermost surfaces of the substrates 10A and 10B contacting the liquid crystal layer 10C, respectively, for orientation of the liquid crystal molecules included in the liquid crystal layer 10C. In this embodiment, vertical alignment films are used.

As illustrated in FIG. 4, the array substrate 10A includes various films stacked on an inner surface of a glass substrate (a substrate). The films on the inner surface of the array substrate 10A will be described in detail with reference to FIG. 4. As illustrated in FIG. 4, the array substrate 10A includes a first metal film 21 (a conductive film), a first insulator 22 (a lower layer-side insulator, an insulator), a semiconductor film 23, a second insulator 24 (a gate insulator, an insulator), a second metal film 25, a third insulator 26 (an insulator), a third metal film 27 (a conductive film), a fourth insulator 28 (an insulator), a fifth insulator 29 (an insulator), a transparent electrode film 30, and the alignment film. The first insulator 22 is disposed in a layer upper than the first metal film 21. The semiconductor film 23 is disposed in a layer upper than the first insulator 22. The second insulator 24 is disposed in a layer upper than the semiconductor film 23. The second metal film 25 is disposed in a layer upper than the second insulator 24. The third insulator 26 is disposed in a layer upper than the second metal film 25. The third metal film 27 is disposed in a layer upper than the third insulator 26. The fourth insulator 28 is disposed in a layer upper than the third metal film 27. The fifth insulator 29 is disposed in a layer upper than the fourth insulator 28. The transparent electrode film 30 is disposed in a layer upper than the fifth insulator 29. The alignment film is disposed in a layer upper than the transparent electrode film 30.

Figure 8:
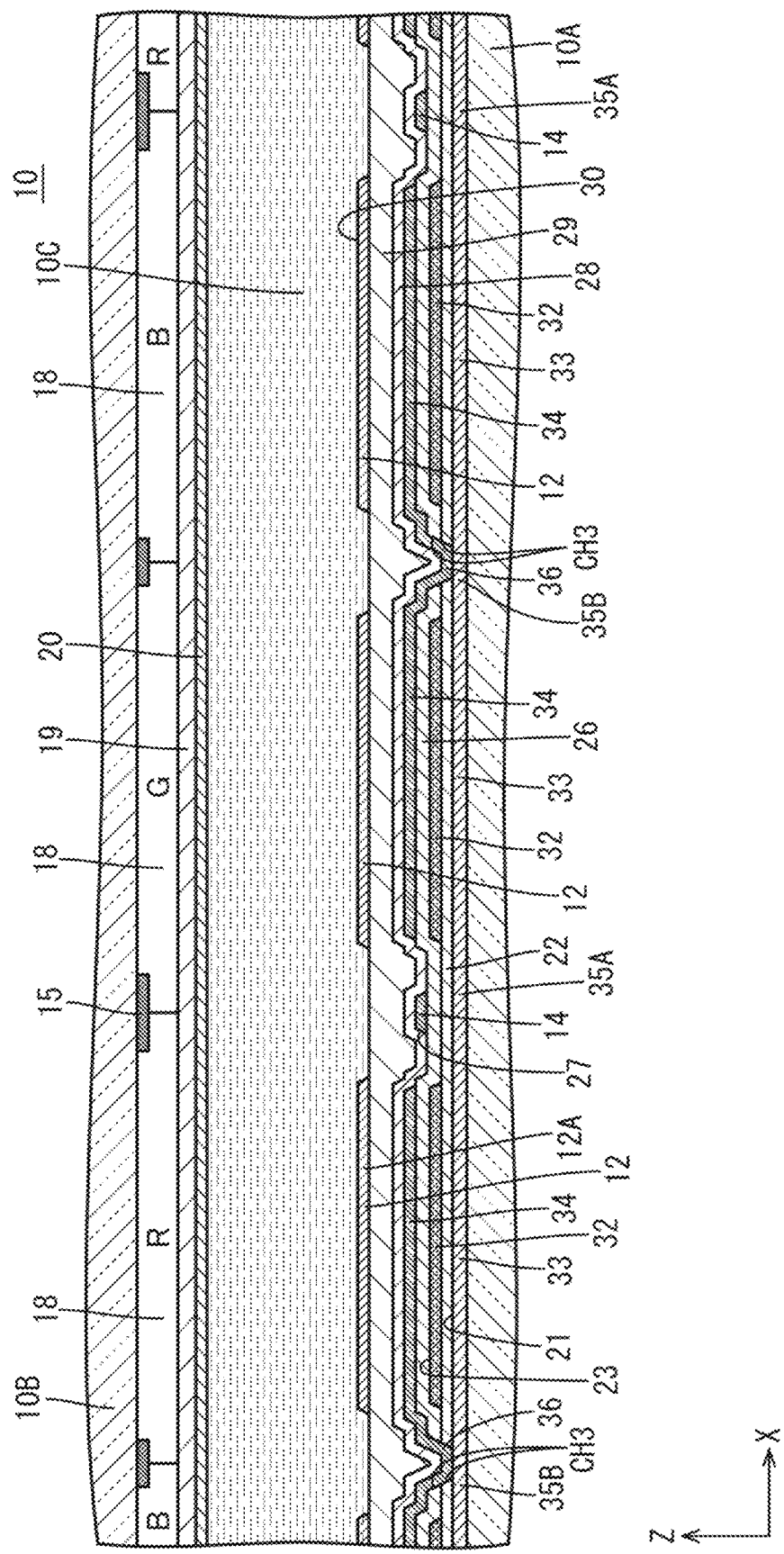
FIG. 8 is a cross-sectional view of a liquid crystal panel along line B-B in FIG. 2.
Figure 9:
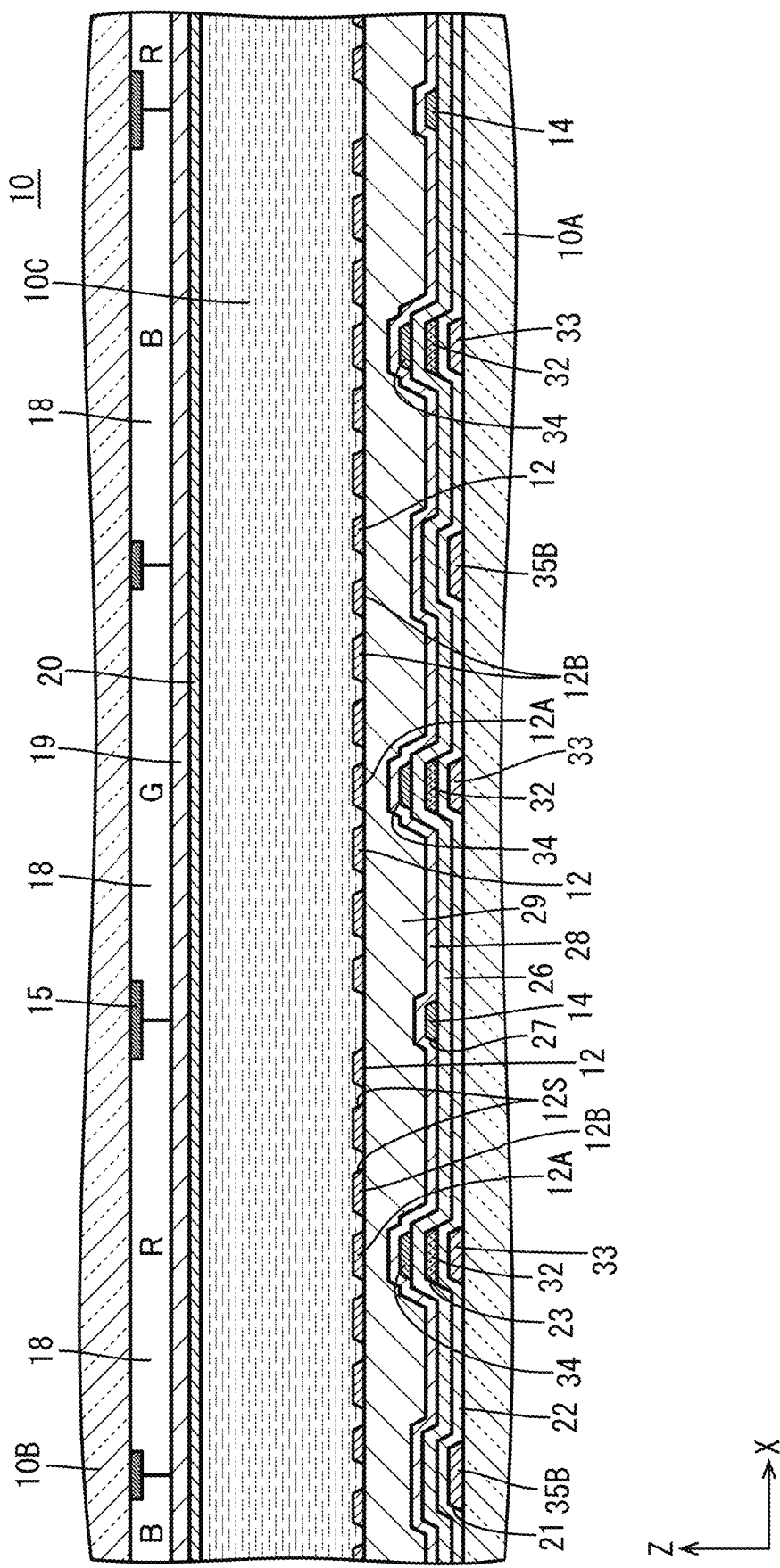
FIG. 9 is a cross-sectional view of a liquid crystal panel along line C-C in FIG. 2.

Each of the first metal film 21, the second metal film 25, and the third metal film 27 has a single-layer film made of one kind of metal or a multilayer film made of multiple kinds of metals or an alloy to have conductivity and a light blocking property. As illustrated in FIG. 4, the first metal film 21 includes sections that are configured as the light blocking portion 17. The second metal film 25 includes sections that are configured as the gate lines 13 and the gate electrodes 11A of the TFTs 11. The semiconductor film 23 is an oxide semiconductor film using an oxide semiconductor as a material. The semiconductor film 23 includes sections that are configured as the source regions 11B, the drain regions 11C, and the channel regions 11D of the TFTs 11. The material of the semiconductor film 23 may be an indium gallium zinc oxide (In—Ga—Zn—O) semiconductor. The In—Ga—Zn—O semiconductor is a ternary oxide containing indium (In), gallium (Ga), and zinc (Zn). In, Ga, and Zn may be contained at a ratio expressed by, but not limited to, In:Ga:Zn=2:2:1, In:Ga:Zn=1:1:1, or In:Ga:Zn=1:1:2. The In—Ga—Zn—O semiconductor may have an amorphous structure or a crystalline structure. When the In—Ga—Zn—O semiconductor having the crystalline structure is used, a crystalline In—Ga—Zn—O semiconductor having a c-axis that is substantially perpendicular to a layer surface is preferable. The semiconductor film 23 includes sections (not overlapping the second metal film 25) having resistances that are reduced in the production process, that is, the semiconductor film 23 includes the resistance-reduced sections and resistance non-reduced sections. In FIGS. 4, 8 and 9, the resistance reduced sections of the semiconductor film 23 are indicated by cross-hatching. The resistivity of the resistance reduced sections of the semiconductor film 23 is significantly small in comparison to the resistance non-reduced sections, for example, about $1/10000000000$ to $1/100$ of the resistivity of the resistance non-reduced sections. Therefore, the resistance reduced sections function as conductors. The resistance reduced sections of the semiconductor film 23 are configured as, but not limited to, the source regions 11B and the drain regions 11C of the TFTs 11. In the resistance non-reduced sections of the semiconductor film 23, charge transfer is allowed only under certain conditions (when scanning signals are supplied to the gate electrodes 11A). In the resistance reduced sections, the charge transfer is always allowed and thus the resistance reduced sections function as conductors. The resistance non-reduced sections of the semiconductor film 23 are configured as the channel regions 11D. The transparent electrode film 30 is made of a transparent electrode material such as indium tin oxide (ITO) and indium zinc oxide (IZO) and configured as, but not limited to, the pixel electrodes 12.

The first insulator 22, the second insulator 24, and the third insulator 26 are made of an inorganic insulating material (an inorganic resin material) such as $SiO_2$ (oxide silicon, silicon oxide). The fourth insulator 28 is made of an inorganic insulating material such as SiNx (silicon nitride). The fifth insulator 29 is made of PMMA (an acrylic resin), which is one kind of organic insulating materials (organic materials) having photosensitivity. The first insulator 22 is disposed between the first metal film 21 and the semiconductor film 23 to the first metal film 21 from the semiconductor film 23. The second insulator 24 is disposed between the semiconductor film 23 and the second metal film 25 to insulate the semiconductor film 23 from the second metal film 25. A distance between each of the gate electrodes 11A and the corresponding channel region 11D is maintained constant with sections of the second insulator 24 overlapping the gate electrodes 11A. The second insulator 24 is patterned using the second metal film 25 in the upper layer as a mask in the production of the array substrate 10A and thus sections of the second insulator 24 overlapping the second metal film 25 remain. The third insulator 26 is disposed between the semiconductor film 23 and the second metal film 25 and the third metal film 27 to insulate the films 23, 25, and 27 from each other. Sections of the third insulator 26 disposed at intersections between the gate lines 13 prepared from the first metal film 21 and the source lines 14 prepared from the second metal film 25 to insulate the gate lines 13 and the source lines 14 from each other. The fourth insulator 28 and the fifth insulator 29 are disposed between the third metal film 27 and the transparent electrode film 30 to insulate the third metal film 27 and the transparent electrode film 30 from each other. The fifth insulator 29 has a thickness larger than thicknesses of other insulators 22, 24, 26, and 28 that are made of inorganic resin materials and a function for planarizing a surface of the array substrate 10A. The fourth insulator 28 and the fifth insulator 29 of the insulators 22, 24, 26, 28, and 29 include pixel electrode contact holes CH1 (contact holes) at positions at which the drain regions 11C of the TFTs 11 overlap the pixel electrodes 12. The drain regions 11C of the TFTs 11 are connected to the pixel electrodes 12 via the pixel electrode contact holes CH1. Drain connecting portions 31 prepared from the third metal film 27 are disposed to overlap the pixel electrode contact holes CH1. The pixel electrode contact holes CH1 are drilled through the third insulator 26. The drain connecting portions 31 are connected to the drain regions 11C. The drain regions 11C are connected to the pixel electrodes 12 via the drain connecting portions 31. The pixel electrode contact holes CH1 in the third insulator 26 are covered with the drain connecting portions 31. Therefore, during etching of the third metal film 27 via a patterned photoresist, the drain regions 11C are less likely to be over-etched. The third insulator 26 includes source line contact holes CH2 at positions at which the source line branches 14A of the source lines 14 overlap the source regions 11B of the TFTs 11. The source line branches 14A of the source lines 14 are connected to the source regions 11B of the TFTs 11 via the source line contact holes CH2.

Figure 5:
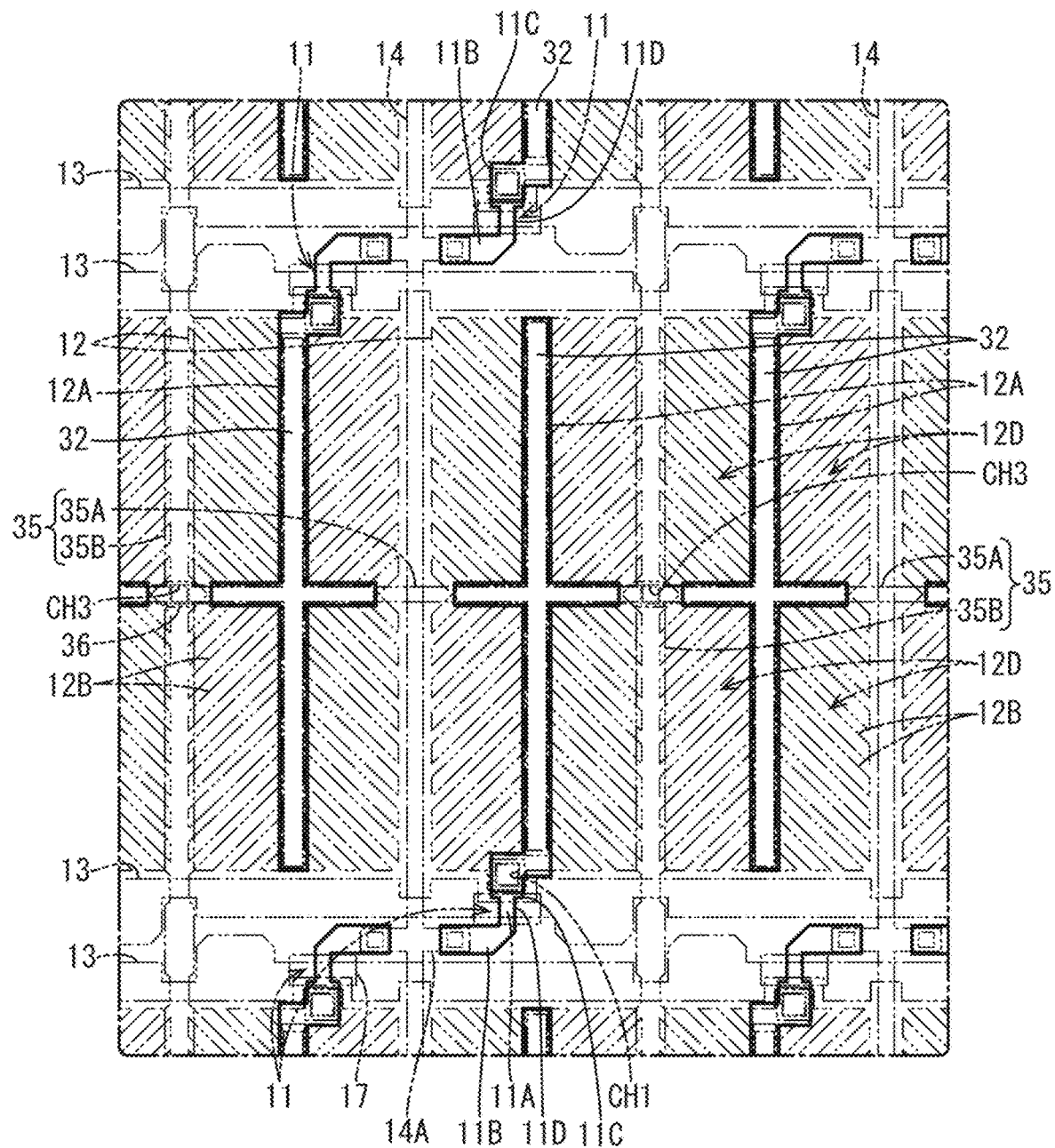
FIG. 5 is a plan view mainly illustrating a pattern of a semiconductor film included in the array substrate.
Figure 6:
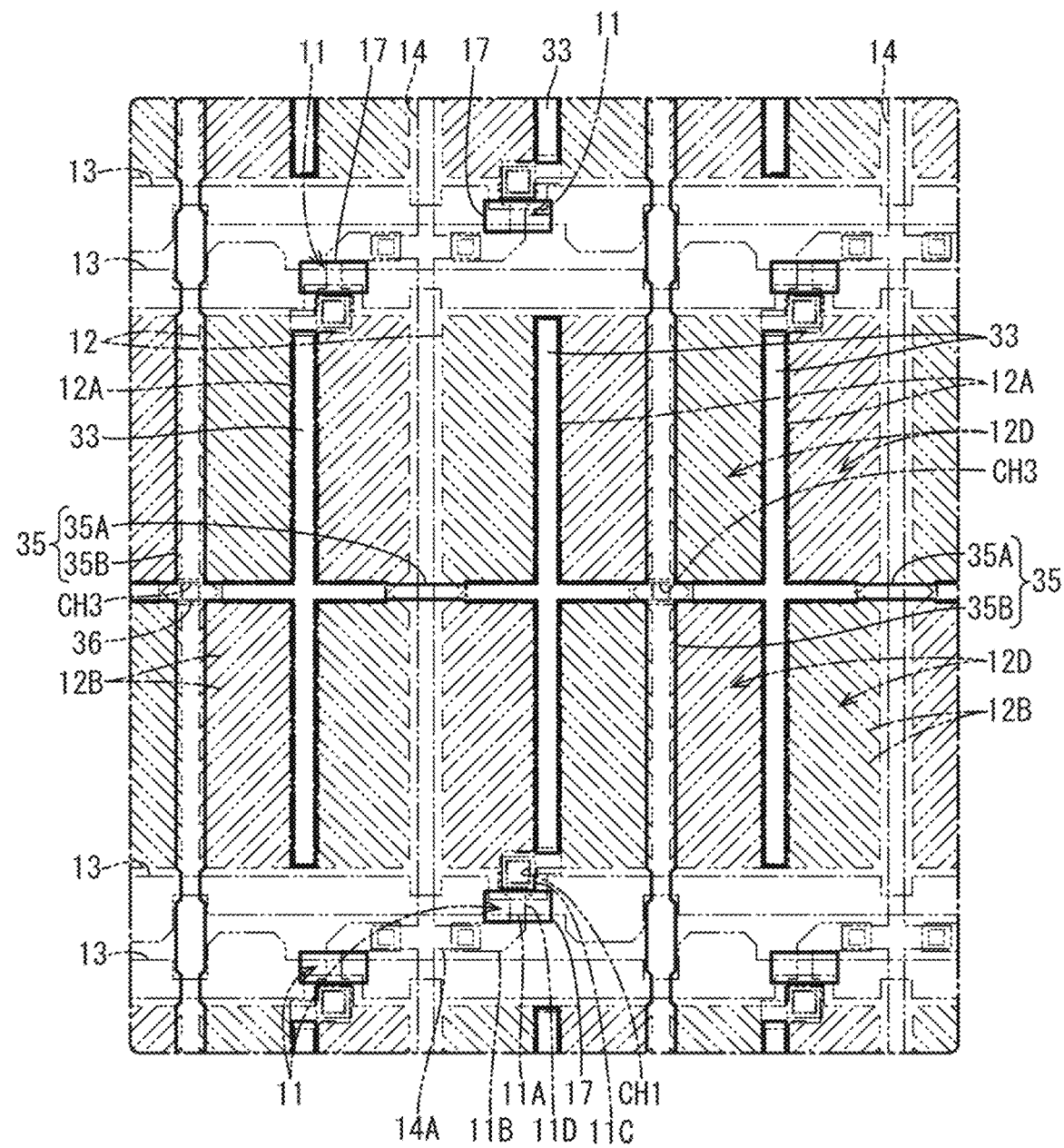
FIG. 6 is a plan view mainly illustrating a pattern of a first metal film included in the array substrate.
Figure 7:
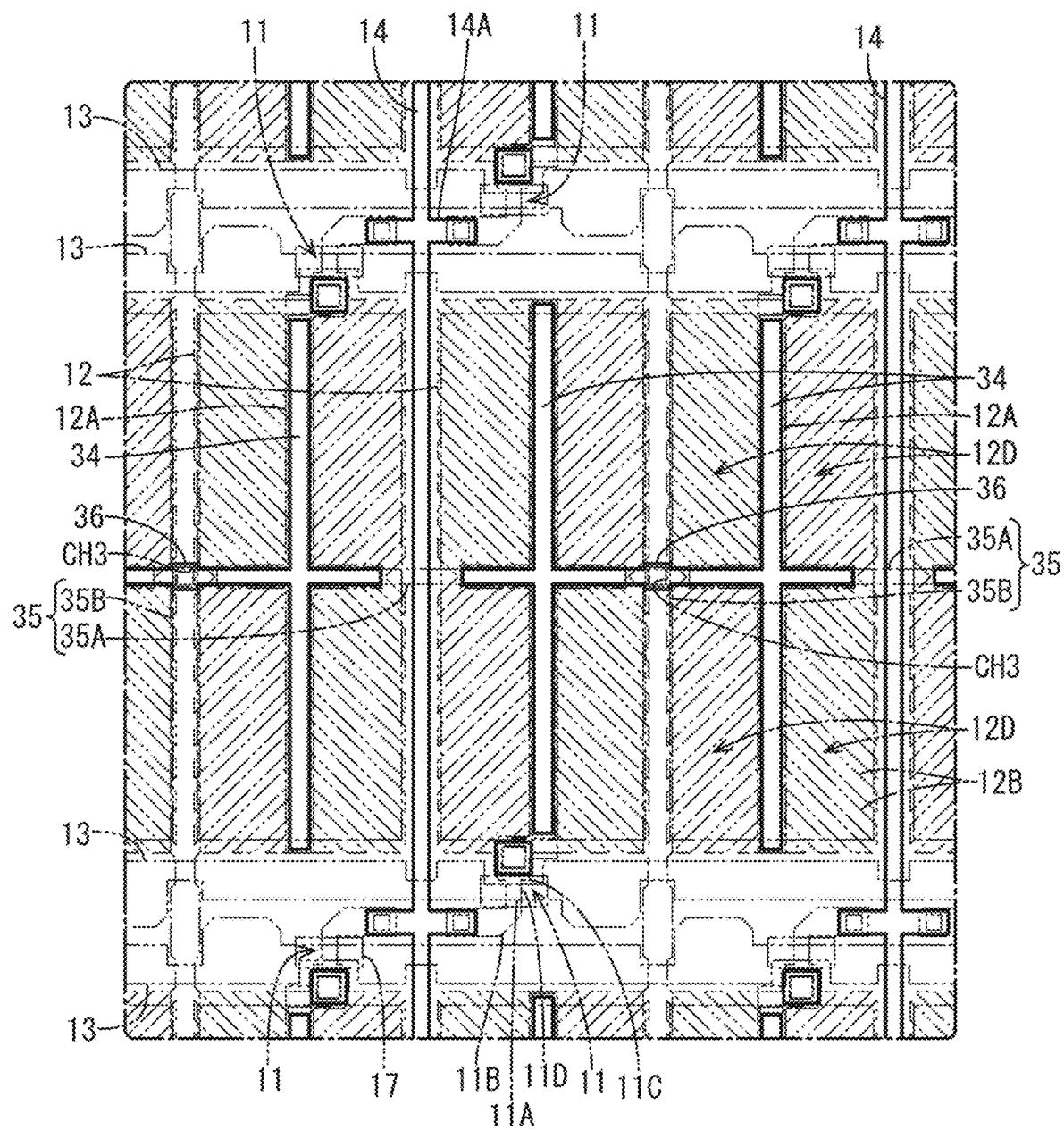
FIG. 7 is a plan view mainly illustrating a pattern of a third metal film included in the array substrate.

As illustrated in FIGS. 5 to 7, the array substrate 10A in this embodiment includes electrode connecting portions 32, first capacitance forming portions 33, and second capacitance forming portions 34 disposed to overlap the pixel electrodes 12. The electrode connecting portions 32, the first capacitance forming portions 33, and the second capacitance forming portions 34 are arranged in matrixes along the X-axis direction and the Y-axis direction in the display area of the array substrate 10A, similar to the overlapping pixel electrodes 12. The number of the electrode connecting portions 32, the number of the first capacitance forming portions 33, the number of the second capacitance forming portions 34, and the number of the pixel electrodes 12 are equal to one another. The pixel electrodes 12, the electrode connecting portions 32, the first capacitance forming portions 33, and the second capacitance forming portions 34 disposed to overlap one another are disposed in different layers on the array substrate 10A. The insulators 22, 26, 28 and 29 are disposed among them. FIG. 5 is a plan view illustrating a pattern of the semiconductor film 23 of the array substrate 10A by solid lines and the other metal films 21, 25 and 27 of the array substrate 10A by long-dashed double-dotted lines. FIG. 6 is a plan view illustrating a pattern of the first metal film 21 of the array substrate 10A by solid lines and the other metal films 25 and 27 and the semiconductor film 23 of the array substrate 10A by long-dashed double-dotted lines. FIG. 7 is a plan view illustrating a pattern of the third metal film 27 of the array substrate 10A by solid lines and the other metal films 21 and 25 and the semiconductor film 23 of the array substrate 10A by long-dashed double-dotted lines. Configurations of the electrode connecting portions 32, the first capacitance forming portions 33, and the second capacitance forming portions 34 will be described in detail in sequence.

As illustrated in FIG. 5, the electrode connecting portions 32 including the resistance reduced sections of the semiconductor film 23 are connected to the pixel electrodes 12. Specifically, each of the electrode connecting portions 32 has a cross shape in a plan view and is disposed to overlap the trunk electrode portion 12A of each of the pixel electrodes 12, that is, the borders between the adjacent domains 12D. The electrode connecting portions 32 having the cross shape in the plan view include sections that extend in the X-axis direction and sections that extend in the Y-axis direction. The electrode connecting portions 32 including the resistance reduced sections of the semiconductor film 23 are coupled to the drain regions 11C including the resistance reduced portions. Therefore, the electrode connecting portions 32, the drain regions 11C, and the pixel electrodes 12 are at the same potential. According to the configurations, the image signals transmitted through the source lines 14 when the TFTs 11 are turned on are supplied from the source regions 11B to the drain regions 11C, the pixel electrodes 12, and the electrode connecting portions 32 via the channel regions 11D.

The first capacitance forming portions 33 will be described in detail. As illustrated in FIG. 6, each of the first capacitance forming portions 33 has a cross shape in a plan view and about an entire area of the first capacitance forming portion 33 overlaps the electrode connecting portion 32. The first capacitance forming portions 33 are prepared from the first metal film 21 from which the light blocking portions 17 are prepared. Therefore, the first capacitance forming portions 33 are disposed to overlap the trunk electrode portions 12A of the pixel electrodes 12, that is, borders between the adjacent domains 12D. In the sections of the pixel electrode 12 around the borders between the domains 12D, it is difficult to orient the liquid crystal molecules in a target direction, that is, a direction along the slits 12S in which the pixel electrode 12 is not present. Therefore, an amount of transmitting light tends to be smaller. According to the configuration in which the first capacitance forming portion 33 is disposed to overlap the sections of the pixel electrode 12 around the borders between the adjacent domains 12D, a reduction in transmitting light due to the first capacitance forming portion 33 prepared from the first metal film 21 that blocks light and disposed to overlap the pixel electrode 12 is less likely to occur. In comparison to a configuration in which the first capacitance forming portion 33 is disposed not to overlap the trunk electrode portion 12A but to overlap the domains 12D, the aperture ratio improves. The first capacitance forming portions 33 having the cross shape in the plan view include sections that extend in the X-axis direction and sections that extend in the Y-axis direction. The sections of the first capacitance forming portions 33 extending in the X-axis direction overlap the sections of the trunk electrode portions 12A extending in the X-axis direction, that is, the borders between the domains 12D adjacent to each other in the Y-axis direction. The sections of the first capacitance forming portions 33 extending in the Y-axis direction overlap the sections of the trunk electrode portions 12A extending in the Y-axis direction, that is, the borders between the domains 12D adjacent to each other in the X-axis direction. As illustrated in FIGS. 8 and 9, the first capacitance forming portions 33 prepared from the first metal film 21 are disposed to overlap the electrode connecting portions 32 prepared from the semiconductor film 23 only via the first insulator 22. In comparison to the pixel electrodes 12, the first capacitance forming portions 33 are closer to the electrode connecting portions 32 by the thicknesses of the third insulator 26, the fourth insulator 28, and the fifth insulator 29. Therefore, in comparison to capacitances between the pixel electrodes 12 and the first capacitance forming portions 33 in a configuration in which the electrode connecting portions 32 are not provided, the capacitances between the electrode connecting portions 32 and the first capacitance forming portions 33 are larger. According to the configuration, the potentials are stable held at the pixel electrodes 12.

As illustrated in FIG. 7, the second capacitance forming portions 34 are prepared from the third metal film 27 from which the source lines 14 are prepared. Each of the second capacitance forming portions 34 has a cross shape in the plan view similar to the shapes of each of the electrode connecting portions 32 and each of the first capacitance forming portions 33. About entire areas of the second capacitance forming portions 34 overlap the electrode connecting portions 32. The second capacitance forming portions 34 are disposed to overlap the trunk electrode portions 12A of the pixel electrodes 12, that is, the borders between the adjacent domains 12D. According to the configuration, the reduction in amount of transmitting light which may result from arrangement of the second capacitance forming portions 34 prepared from the third metal film 27 that blocks light to overlap the pixel electrodes 12 is less like to occur. In comparison to a configuration in which the second capacitance forming portions 34 are disposed not to overlap the trunk electrode portions 12A but to overlap the domains 12D, the aperture ratio improves. The second capacitance forming portions 34 having the cross shape in the plan view include the sections that extend in the X-axis direction and the sections that extend in the Y-axis direction. The sections of the second capacitance forming portions 34 extending in the X-axis direction overlap the sections of the trunk electrode portions 12A extending in the X-axis direction, that is, the borders between the domains 12D that are adjacent to each other in the Y-axis direction. The sections of the second capacitance forming portions 34 extending in the Y-axis direction overlap the sections of the trunk electrode portions 12A extending in the Y-axis direction, that is, the borders between the domains 12D that are adjacent to each other in the X-axis direction. As illustrated in FIGS. 8 and 9, the second capacitance forming portions 34 prepared from the third metal film 27 are disposed to overlap the electrode connecting portions 32 prepared from the semiconductor film 23 from the upper layer side via the third insulator 26. Furthermore, the second capacitance forming portions 34 are disposed to overlap the pixel electrodes 12 prepared from the transparent electrode film 30 from the lower layer side via the fourth insulator 28 and the fifth insulator 29. The second capacitance forming portions 34 are connected to the first capacitance forming portions with connecting structures (including connecting portions 36), which will be described later, so that the first capacitance forming portions 33 and the second capacitance forming portions 34 are at the same potential. The first capacitance forming portions 33 and the second capacitance forming portions 34 are held at the reference potential supplied via the capacitance lines 35 to form capacitances with the overlapping pixel electrodes 12 and the electrode connecting portions 32. The capacitances between the pixel electrodes 12 or the electrode connecting portions 32 and the first capacitance forming portions 33 or the second capacitance forming portions 34 are larger in comparison to the known technology. Therefore, the potentials are stably held at the pixel electrodes 12 that are charged when the TFTs 11 are turned on.

As illustrated in FIG. 6, the first capacitance forming portions 33 arranged in the matrix along the X-axis direction and the Y-axis direction within the display area of the array substrate 10A are coupled to the capacitance lines 35. The capacitance lines 35 are provided for supplying the reference potential to the first capacitance forming portions 33. The capacitance lines 35 include first capacitance lines 35A and second capacitance lines 35B. The first capacitance lines 35A are coupled to the first capacitance forming portions 33 that are adjacent in the X-axis direction. The second capacitance lines 35B are coupled to the first capacitance forming portions 33 that are adjacent in the Y-axis direction. The first capacitance lines 35A are prepared from the first metal film 21 from which the light blocking portions 17 and the first capacitance forming portions 33 are prepared. The first capacitance lines 35A extend in the X-axis direction and include ends that are coupled to the first capacitance forming portions 33 that are adjacent in the X-axis direction. The second capacitance lines 35B are prepared from the first metal film 21 from which the light blocking portions 17, the first capacitance forming portions 33, and the first capacitance lines 35A are prepared. The second capacitance lines 35B extend in the Y-axis direction and include ends that are coupled to the first capacitance forming portions 33 that are adjacent in the Y-axis direction. The first capacitance forming portions 33 arranged in the matrix along the X-axis direction and the Y-axis direction are connected to one another via the first capacitance lines 35A and the second capacitance lines 35B that are routed in a grid along the X-axis direction and the Y-axis direction. Therefore, standard deviation in distribution regarding resistances is smaller. Namely, regardless of positions within the display area, each of the first capacitance forming portions 33 is properly held at a certain reference potential. The potentials at the pixel electrodes 12 and the electrode connecting portions 32 that form the capacitances with the first capacitance forming portions 33 and the second capacitance forming portions 34 are stably held. Therefore, the display quality of the display images improves. The first capacitance forming portions 33, the first capacitance lines 35A, and the second capacitance lines 35B are prepared from the first metal film 21. The first capacitance forming portions 33, the first capacitance lines 35A, and the second capacitance lines 35B are directly connected to one another, that is, contact holes are not required for connecting them. Because a reduction in aperture ratio of the pixel electrodes 12 resulting from the connecting structures including the contact holes is less likely to occur, the aperture ratio of the pixel electrodes 12 is maintained high. This contributes to an increase in brightness of display images and a reduction in power consumption.

Next, the first capacitance lines 35A and the second capacitance lines 35B will be described in detail. As illustrated in FIG. 6, each of the first capacitance lines 35A connects two first capacitance forming portions 33 that sandwich the source line 14 among the first capacitance forming portions 33 arranged in the X-axis direction. Namely, the first capacitance lines 35A are separated from each other in the X-axis direction such that two first capacitance forming portions 33 (the pixel electrodes 12) and one second capacitance line 35B are sandwiched therebetween. The number of the first capacitance lines 35A in the X-axis direction is about equal to the number of the source lines 14. The first capacitance lines 35A are coupled to sections of the first capacitance forming portions 33 extending in the X-axis direction to form a straight line. Namely, the Y-axis position of each of the first capacitance lines 35A is aligned with the Y-axis position of the sections of the first capacitance forming portions 33 extending in the X-axis direction. The first capacitance lines 35A and the first capacitance forming portions 33 are coupled to one another in the shortest routing. A reduction in amount of light transmitting through the pixel electrodes 12 resulting from them is less likely to occur. According to the configuration, the aperture ratio can be further improved. The first capacitance lines 35A cross the source lines 14. As described earlier, the first capacitance lines 35A are prepared from the first metal film 21 from which the light blocking portions 17 and the first capacitance forming portions 33 are prepared. As illustrated in FIG. 8, the first capacitance lines 35A overlap the source lines 14 with the first insulator 22 and the third insulator 26 between the first capacitance lines 35A and the source lines 14.

As illustrated in FIG. 6, each of the second capacitance lines 35B is sandwiched between two pixel electrodes 12 that are sandwiched between the source lines 14 that are adjacent to each other. Each of the second capacitance lines 35B are coupled to two first capacitance forming portions 33 sandwiched between the source lines 14 among the first capacitance forming portions 33 arranged in the X-axis direction. Namely, the second capacitance lines 35B are separated from each other in the X-axis direction such that two first capacitance forming portions 33 (the pixel electrodes 12) and one first capacitance line 35A are sandwiched therebetween. The number of the second capacitance lines 35B in the X-axis direction is about equal to the number of the source lines 14 or the number of the first capacitance lines 35A. The first capacitance lines 35A and the second capacitance lines 35B are alternately arranged in the X-axis direction to sandwich the first capacitance forming portions 33 (the pixel electrodes 12) therebetween. The second capacitance lines 35B extend in the Y-axis direction for about an entire length of the display area in the Y-axis direction. The second capacitance lines 35B are coupled to all the first capacitance forming portions 33 arranged in the Y-axis direction in the display area. Each of the second capacitance lines 35B is provided in a space between two pixel electrodes 12 that are sandwiched between the source lines 14 that are adjacent to each other. In comparison to a configuration in which the second capacitance lines 35B are disposed to overlap the pixel electrodes 12, a larger amount of light transmitted through the pixel electrodes 12 can be obtained. This configuration is preferable for increasing the aperture ratio. Each of the second capacitance lines 35B has the width larger than the width of each of the source lines 14. The side edges of the second capacitance line 35B overlap the side edges of the adjacent pixel electrodes 12. As described earlier, the second capacitance lines 35B are prepared from the first metal film 21 from which the light blocking portions 17, the first capacitance forming portions 33, and the first capacitance lines 35A. As illustrated in FIG. 9, the side edges of each of the second capacitance lines 35B overlap the side edges of the pixel electrodes 12 via the first insulator 22, the third insulator 26, the fourth insulator 28, and the fifth insulator 29. Because the light blocking portions 17, the first capacitance forming portions 33, the first capacitance lines 35A, and the second capacitance lines 35B are prepared from the first metal film 21, they can be patterned using the same photomask in the production. This configuration is preferable for reducing the number of required photomasks.

Next, coupling structures between the second capacitance forming portions 34 and coupling structures between the first capacitance forming portions 33 and the second capacitance forming portions 34 will be described. As illustrated in FIG. 7, connecting portions 36 are disposed in the display area of the array substrate 10A. The connecting portions 36 connect the second capacitance forming portions 34 that are adjacent in the X-axis direction to each other. Specifically, each of the connecting portions 36 are coupled to two second capacitance forming portions 34 that overlap the pixel electrodes 12 that are adjacent to each other with the second capacitance line 35B therebetween, respectively. The connecting portions 36 are prepared from the third metal film 27 from which the second capacitance forming portions 34 are prepared and directly connected to the second capacitance forming portions 34 without contact holes. Because two second capacitance forming portions 34 are coupled together with the connecting portion 36, the standard deviation in distribution regarding resistances of the first capacitance forming portions 33 and the second capacitance forming portions 34 can be further reduced. Therefore, the potentials are stably held at the pixel electrodes 12. Each of the connecting portions 36 are sandwiched between two pixel electrodes 12 that are sandwiched between the adjacent source lines 14 to cross and overlap the second capacitance line 35B. As illustrated in FIG. 8, the connecting portions 36 prepared from the third metal film 27 are connected to the second capacitance lines 35B prepared from the first metal film 21 via contact holes CH3 drilled through the first insulator and the third insulator 26 disposed between the connecting portions 36 and the second capacitance lines 35B. According to the configuration, sections of the connecting portions 36 and the second capacitance lines 35B overlapping each other are used for the connection therebetween. In comparison to a configuration in which the connecting portions 36 include extending sections that are connected to the second capacitance lines 35B, a reduction in amount of light transmitted through the pixel electrodes 12 resulting from the connection between the connecting portions 36 and the second capacitance lines 35B is less likely to occur. According to the configuration, the aperture ratio increases. The number of the connecting portions 36 in the X-axis direction is about equal to the number of the second capacitance lines 35B.

As described above, the array substrate 10A includes the pixel electrodes 12 (the electrodes), the first capacitance forming portions 33, the electrode connecting portions 32, and the second capacitance forming portions 34. The first capacitance forming portions 33 are disposed to overlap the pixel electrodes 12 via the insulators 22, 26, 28 and 29. The electrode connecting portions 32 are connected to the pixel electrodes 12 and disposed between the pixel electrodes 12 and the first capacitance forming portions 33. The electrode connecting portions 32 are disposed to overlap the pixel electrodes 12 and the first capacitance forming portions 33 via the insulators 22, 26, 28 and 29. The second capacitance forming portions 34 are connected to the first capacitance forming portions 33 and disposed between the pixel electrodes 12 and the electrode connecting portions 32. The first capacitance forming portions 33 are disposed to overlap the pixel electrodes 12 and the electrode connecting portions 32 via the insulators 26, 28 and 29.

The pixel electrodes 12 and the electrode connecting portions 32 to which the pixel electrodes 12 are connected are at the same potential. The first capacitance forming portions 33 and the second capacitance forming portions 34 to which the first capacitance forming portions 33 are connected are at the same potential. The electrode connecting portions 32 are disposed between the pixel electrodes 12 and the first capacitance forming portions 33 that overlap each other. The electrode connecting portions 32 are disposed to overlap the pixel electrodes 12 and the first capacitance forming portions 33 via the insulators 22, 26, 28 and 29. The second capacitance forming portions 34 are disposed between the pixel electrodes 12 and the electrode connecting portions 32. The second capacitance forming portions 34 are disposed to overlap the pixel electrodes 12 and the electrode connecting portions 32 via the insulators 26, 28 and 29. When the pixel electrodes 12 are charged, the capacitances are formed between the pixel electrodes 12 and the second capacitance forming portions 34. Furthermore, the capacitances are formed between the electrode connecting portions 32 at the same potential as the pixel electrodes 12 and the second capacitance forming portions 34. Still furthermore, the capacitances are formed between the electrode connecting portions 32 and the first capacitance forming portions 33. According to the configuration, the capacitances between the pixel electrodes 12 and the electrode connecting portions 32 and between the first capacitance forming portions 33 and the second capacitance forming portions 34 are larger in comparison to the known technology. Therefore, the potentials are stably held at the pixel electrodes 12.

The TFTs 11 (the switching components) and the light blocking portions 17 are provided. The TFTs 11 include the gate electrodes 11A, the source regions 11B, the channel regions 11D, and the drain regions 11C. The channel regions 11D are prepared from the semiconductor film 23 and disposed to overlap the gate electrodes 11A from the lower layer side via the second insulator 24 (the gate insulator). The source regions 11B are connected to first ends of the channel regions 11D. The drain regions 11C are connected to second ends of the channel regions 11D and the pixel electrodes 12. The light blocking portions 17 are disposed to overlap the channel regions 11D from the lower layer side via the first insulator 22 (the lower layer insulator). The light blocking portions 17 are prepared from the first metal film 21 (a conductive film) and disposed to overlap the channel regions 11D from a lower layer side via the first insulator 22 (a lower layer-side insulator). The light blocking portions 17 are prepared from the first metal film 21 from which the first capacitance forming portions 33 are prepared. According to the configuration, when signals are supplied to the gate electrodes 11A, the TFTs 11 turn on. The signals are supplied from the source regions 11B to the drain regions 11C via the channel regions 11D. As a result, the pixel electrodes 12 and the electrode connecting portions 32 are charged. Because the light blocking portion 17 is disposed to overlap the channel regions 11D that are prepared from the semiconductor film 23 from the lower layer side via the first insulator 22, light toward the channel regions 11D from the lower layer side can be blocked by the light blocking portion 17. According to the configuration, variations in characteristics of the TFTs 11, which may occur when the channel regions 11D are subjected to the light, are less likely to occur. Because the light blocking portion 17 and the first capacitance forming portions 33 are prepared from the same first metal film 21, they can be patterned using the same photomask in the production. This configuration is preferable for reducing the number of the photomasks. The first capacitance forming portions 33 prepared from the first metal film 21 from which the light blocking portions 17 are prepared form capacitances with the electrodes connecting portions 32 that overlap the first capacitance forming portions 33 via the first insulator 22.

The electrode connecting portions 32 include the resistance reduced sections of the semiconductor film 23. The electrode connecting portions 32 overlap the first capacitance forming portions 33 via the first insulator 22 and the capacitances are formed between the electrode connecting portions 32 and the first capacitance forming portion 33. Because the electrode connecting portions 32 and the channel regions 11D are prepared from the semiconductor film 23, they can be patterned using the same photomask. This configuration is preferable for reducing the number of the required photomasks.

The source lines 14 (the lines) are provided. The source lines are prepared from the third metal film 27 (the conductive film) disposed in the layer upper than the semiconductor film 23 with the third insulator 26 (the insulator) therebetween. The source lines 14 are connected to the source regions 11B on the opposite side from the channel regions 11D. The second capacitance forming portions 34 are prepared from the third metal film 27 from which the source lines 14 are prepared. The signals transmitted through the source lines 14 are supplied to the source regions 11B and then to the drain regions 11C via the channel regions 11D. The second capacitance forming portions 34 prepared from the third metal film 27 disposed in the layer upper than the semiconductor film 23 overlap the electrode connecting portions 32 via the third insulator 26 and the capacitances are formed therebetween. Because the source lines 14 and the second capacitance forming portions 34 are prepared from the third metal film 27, they can be patterned using the same photomask in the production. This configuration is preferable for reducing the number of the required photomasks.

At least the drain regions 11C include the sections of the semiconductor film 23. The pixel electrodes 12 are prepared from the transparent electrode film 30 disposed in the layer upper than the third metal film 27 from which the source lines 14 and the second capacitance forming portions 34 are prepared via the insulators 28 and 29. The insulators 26, 28 and 29 disposed between the transparent electrode film 30 and the semiconductor film 23 include the pixel electrode contact holes CH1 (the contact holes) at the positions at which the pixel electrodes 12 overlap the drain regions 11C. According to the configuration, the pixel electrodes 12 prepared from the transparent electrode film 30 are connected to the drain regions 11C prepared from the semiconductor film 23 via the pixel electrode contact holes CH1 drilled through the insulators 26, 28 and 19 disposed between the pixel electrodes 12 and the drain regions 11C. The second capacitance forming portions 34 prepared from the third metal film 27 overlap the electrode connecting portions 32 from the lower layer side via the third insulator 26 and the capacitances are formed therebetween. The second capacitance forming portions 34 overlap the pixel electrodes 12 from the upper layer side via the insulators 28 and 19 and the capacitances are formed therebetween.

The pixel electrodes 12, the electrode connecting portions 32, the first capacitance forming portions 33, and the second capacitance forming portions 34 are disposed. The capacitance lines 35 are coupled to at least the adjacent first capacitance forming portions 33 or the adjacent second capacitance forming portions 34. According to the configuration, the standard deviation in distribution regarding resistances of at least the first capacitance forming portions 33 or the second capacitance forming portions 34 can be reduced. Therefore, the potentials are stably held at the pixel electrodes 12.

The pixel electrodes 12, the electrode connecting portions 32, the first capacitance forming portions 33, and the second capacitance forming portions 34 are arranged in the first direction and the second direction that crosses the first direction. The gate lines 13 (the first lines), the source lines 14 (the second lines), and the TFTs 11 are provided. The gate lines 13 are disposed between the pixel electrodes 12 that are adjacent in the second direction to extend in the first direction. The source lines 14 are disposed between the pixel electrodes 12 that are adjacent in the first direction to extend in the second direction. The TFTs 11 include the gate electrodes 11A, the source regions 11B, the drain regions 11C, and the channel regions 11D. The gate electrodes 11A are connected to the gate lines 13. The source regions 11B are connected to the source lines 14. The drain regions 11C are connected to the pixel electrodes 12. The channel regions 11D include the first ends connected to the source regions 11B and the second ends connected to the drain regions 11C. The channel regions 11D are disposed to overlap the gate electrodes 11A via the second insulator 24. The channel regions 11D are prepared from the semiconductor film 23. The first capacitance forming portions 33 are prepared from the first metal film 21 that is disposed in the layer lower than the semiconductor film 23 via the first insulator 22. The capacitance lines 35 include the first capacitance lines 35A coupled to the first capacitance forming portions 33 adjacent in the first direction. The first capacitance lines 35A are prepared from the first metal film 21 from which the first capacitance forming portions 33 are prepared. According to the configuration, the TFTs 11 turn on when the signals transmitted through the gate lines 13 are supplied to the gate electrodes 11A. The signals transmitted through the source lines 14 are supplied from the source regions 11B to the drain regions 11C via the channel regions 11D. The pixel electrodes 12 connected to the channel regions 11D are charged to the potentials based on the signals transmitted through the source lines 14. The first capacitance lines 35A are prepared from the first metal film 21 from which the first capacitance forming portions 33 are prepared and coupled to the first capacitance forming portions 33 that are adjacent in the first direction. According to the configuration, the standard deviation in distribution regarding resistances of the first capacitance forming portions 33 arranged in the first direction can be reduced. Therefore, the potentials are further stably held at the pixel electrodes 12.

The source lines 14 are separated from each other to sandwich two pixel electrodes 12 therebetween. The gate lines 13 are disposed such that every two of the gate lines 13 is sandwiched between the pixel electrodes 12 that are adjacent to each other in the second direction. At least two TFTs 11 are disposed such that the TFTs 11 are connected to two gate lines 13 sandwiched between the pixel electrodes 12 that are adjacent in the second direction and the pixel electrodes 12 that are adjacent to the gate lines 13. The capacitance lines 35 include the second capacitance lines 35B coupled to at least the first capacitance forming portions 33 that are adjacent in the second direction or the second capacitance forming portions 34 that are adjacent in the second direction. Each of the second capacitance lines 35B is sandwiched between two pixel electrodes 12 that are sandwiched between the source lines 14 that are adjacent to each other. The source lines 14 are separated from each other to sandwich two pixel electrodes 12. The gate lines 13 are disposed such that two gate lines 13 are sandwiched between the pixel electrodes 12 that are adjacent in the second direction. At least two TFTs 11 are connected to two gate lines 13 sandwiched between the pixel electrodes 12 that are adjacent in the second direction and the pixel electrodes 12 that are adjacent to the gate lines 13. According to the configuration, the pixel electrodes 12 arranged in the first direction and the second direction can be charged to different potentials. According to the arrangement, the space is provided between two pixel electrodes 12 that are sandwiched between the source lines 14 that are adjacent to each other. Each of the second capacitance lines 35B coupled to at least the first capacitance forming portion 33 that is adjacent in the second direction or the second capacitance forming portion 34 that is adjacent in the second direction is disposed in the space. In comparison to a configuration in which the second capacitance lines 35B are disposed to overlap the pixel electrodes 12, a larger amount of light transmitted through the pixel electrodes 12 can be obtained. This configuration is preferable for increasing the aperture ratio.

The connecting portions 36 are provided. The connecting portions 36 are prepared from the third metal film 27 from which the second capacitance forming portions 34 are prepared and coupled to the second capacitance forming portions 34. Because the second capacitance forming portions 34 adjacent to each other with the second capacitance line 35B therebetween are coupled to each other via each connecting portion 36, the standard deviation in distribution regarding resistances of the second capacitance forming portions 34 can be reduced. Therefore, the potentials are further stably held at the pixel electrodes 12.

The connecting portions 36 overlap the first capacitance lines 35A via the insulators 22 and 26. The connecting portions 36 are connected to the first capacitance lines 35A via the contact holes CH3 drilled through the insulators 22 and 26 disposed between the connecting portions 36 and the first capacitance lines 35A. Because the sections of the connecting portions 36 and the first capacitance lines 35A overlapping each other are used for connecting the connecting portions 36 to the first capacitance lines 35A, a reduction in light transmitted through the pixel electrodes 12 resulting from the connection of the connecting portions 36 to the first capacitance lines 35A is less likely to occur. This configuration can increase the aperture ratio.

The second capacitance lines 35B are prepared from the first metal film 21 from which the first capacitance forming portions 33 are prepared and coupled to the first capacitance forming portions 33 that are adjacent in the second direction. The first capacitance forming portions 33 that are adjacent in the first direction are coupled to the first capacitance lines 35A. The first capacitance forming portions 33 that are adjacent in the second direction are coupled to the second capacitance lines 35B. The first capacitance forming portions 33 arranged in the first direction and the second direction are connected to one another via the first capacitance lines 35A and the second capacitance lines 35B that are routed in the grid. Therefore, the standard deviation in distribution regarding resistances is small and thus the potentials are further stably held at the pixel electrodes 12.

Each of the pixel electrodes 12 includes the domains. The first capacitance forming portions 33 and the second capacitance forming portions 34 are disposed to overlap the borders between the adjacent pixel electrodes 12. In the areas of the pixel electrodes 12 around the borders between the domains, it is difficult to orient the liquid crystal molecules to a target direction along the slits 12S at which the pixel electrodes 12 are not present and thus the amount of transmitting light tends to be locally small. With the first capacitance forming portions 33 and the second capacitance forming portions 34 disposed to overlap the borders between the adjacent domains of the pixel electrodes 12, the reduction in amount of transmitting light resulting from the arrangement in which the first capacitance forming portions 33 and the second capacitance forming portions 34 overlap the pixel electrodes 12 is less likely to occur. In comparison to a configuration in which the first capacitance forming portions 33 and the second capacitance forming portions 34 are disposed to overlap the domains, the aperture ratio increases.

The liquid crystal panel 10 (the display device) according to this embodiment includes the array substrate 10A described above and the CF substrate 10B (the opposed substrate) opposed to the array substrate 10A. According to the liquid crystal panel, the potentials at the pixel electrodes 12 included in the array substrate 10A are stably held and thus the display quality can be improved.

Second Embodiment

A second embodiment will be described with reference to FIGS. 10 and 11. The second embodiment includes capacitance lines 135 having a configuration different from that of the first embodiment. Components, functions, and effects similar to those of the first embodiment previously described will not be described.

Figure 10:
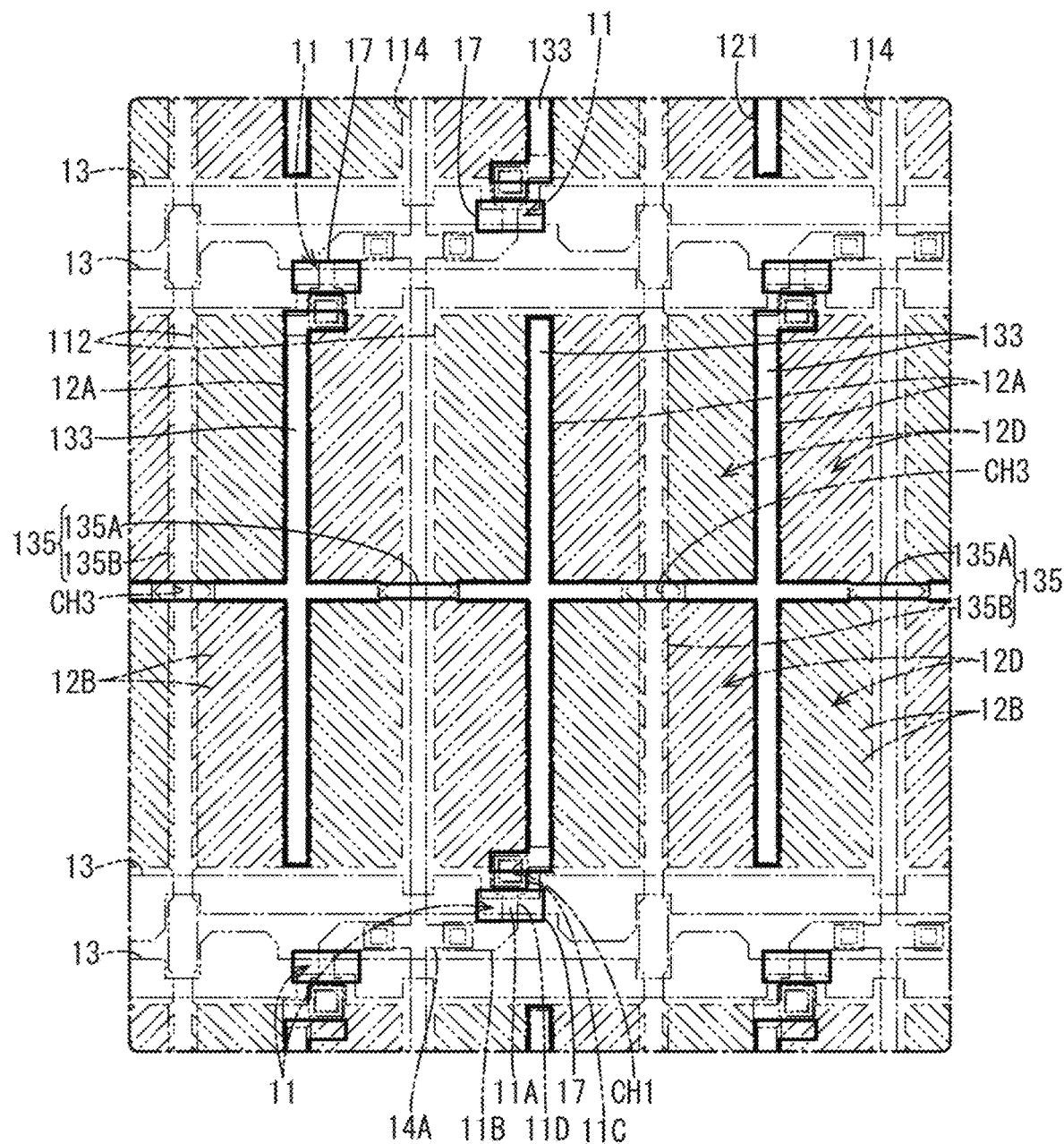
FIG. 10 is a plan view mainly illustrating a pattern of a first metal film included in an array substrate according to a second embodiment.
Figure 11:
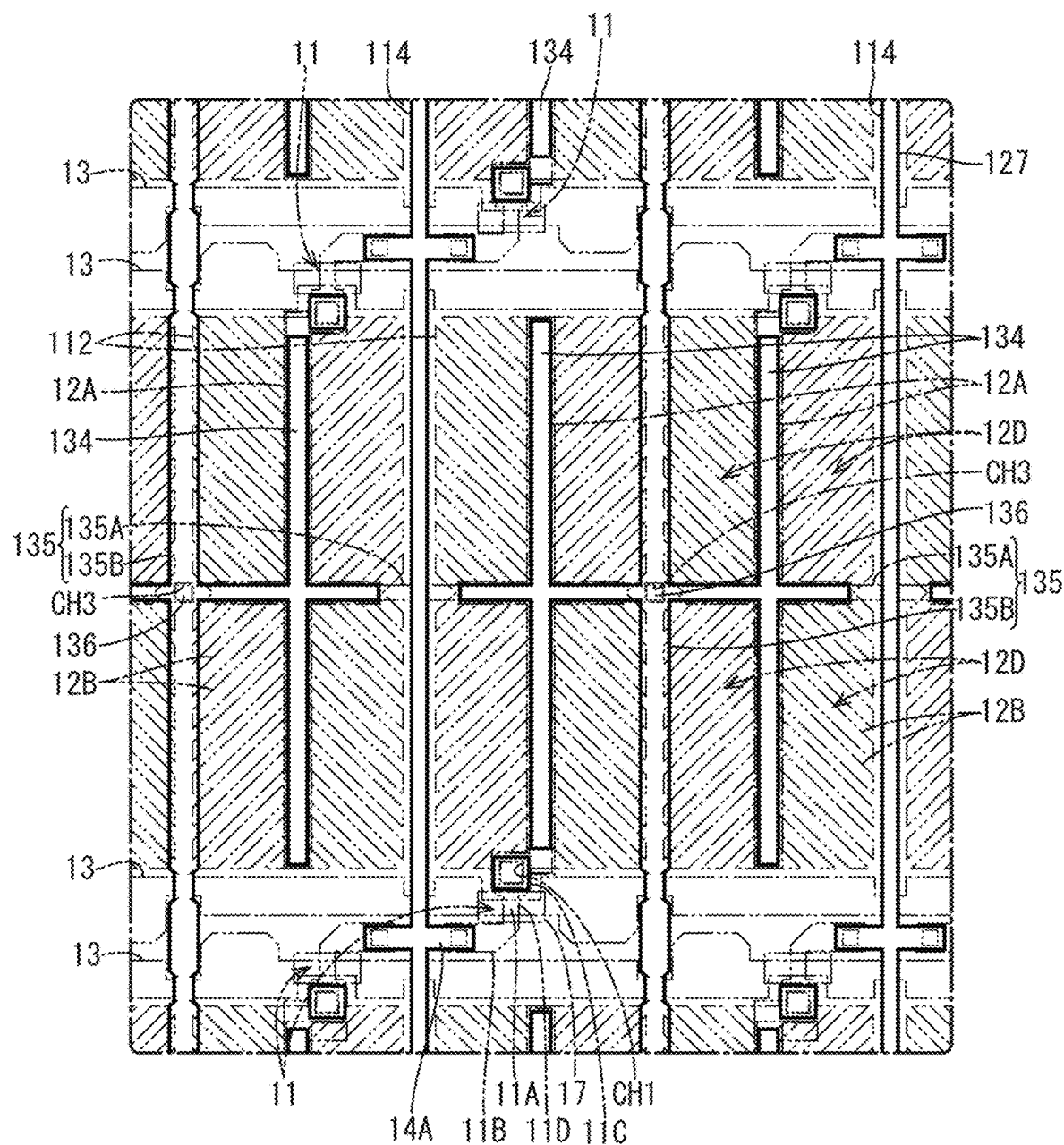
FIG. 11 is a plan view mainly illustrating patterns of a third metal film included in the array substrate.

As illustrated in FIGS. 10 and 11, the capacitance lines 135 in this embodiment include first capacitance lines 135A and second capacitance lines 135B. The first capacitance lines 135A are prepared from the first metal film 121 and coupled to first capacitance forming portions 133. The second capacitance lines 135B are prepared from a third metal film 127 and coupled to second capacitance forming portions 134. As illustrated in FIG. 10, the first capacitance lines 135A prepared from the first metal film 121 from which the first capacitance forming portions 133 are prepared are coupled to the first capacitance forming portions 133 that are adjacent in the X-axis direction. The first capacitance forming portions 133 and the first capacitance lines 135A are alternately arranged in the X-axis direction. The number of the first capacitance lines 135A in the X-axis direction is equal to the number of the first capacitance forming portions 133 (the pixel electrodes 112) arranged in the X-axis direction minus 1. The first capacitance forming portions 133 arranged in the X-axis direction are connected to each other via the first capacitance lines 135A disposed therebetween but the first capacitance forming portions 133 arranged in the Y-axis direction are not directly connected.

As illustrated in FIG. 11, the second capacitance lines 135B prepared from the third metal film 127 from which the second capacitance forming portions 134 are prepared are coupled to the second capacitance forming portions 134 that extend in the Y-axis direction and are adjacent to each other in the Y-axis direction. The second capacitance lines 135B and the source lines 114 are alternately arranged in the X-axis direction. Each of the second capacitance lines 135B is coupled to the two second capacitance forming portions 134 that are adjacent to each other in the X-axis direction with the second capacitance line 135B therebetween via a corresponding connecting portion 136. The connecting portions 136 coupled to the second capacitance forming portions 134 and the second capacitance lines 135B are connected to the first capacitance lines 135A via the contact holes CH3 drilled through the first insulator and the third insulator disposed between the connecting portions 136 and the first capacitance lines 135A to overlap the first capacitance lines 135A. According to the configuration, the first capacitance lines 135A are connected to the second capacitance lines 135B.

As described above, in this embodiment, the second capacitance lines 135B are prepared from the third metal film 127 from which the second capacitance forming portions 134 are prepared and coupled to the second capacitance forming portions 134 adjacent in the second direction. The first capacitance forming portions 133 adjacent in the first direction are coupled to the first capacitance lines 135A. The second capacitance forming portions 134 adjacent in the second direction are coupled to the second capacitance lines 135B. The first capacitance forming portions 133 and the second capacitance forming portions 134 are connected to each other and held at the same potential. Therefore, with the first capacitance lines 135A and the second capacitance lines 135B routed in the grid, the standard deviation in distribution regarding resistances is small. According to the configuration, the potentials are further stably held at the pixel electrodes 112.

Third Embodiment

A third embodiment will be described with reference to FIGS. 12 to 15. The third embodiment includes TFTs 211, gate lines 213, and source lines 214 that are arranged differently from the first embodiment. Components, functions, and effects similar to those of the first embodiment previously described will not be described.

Figure 12:
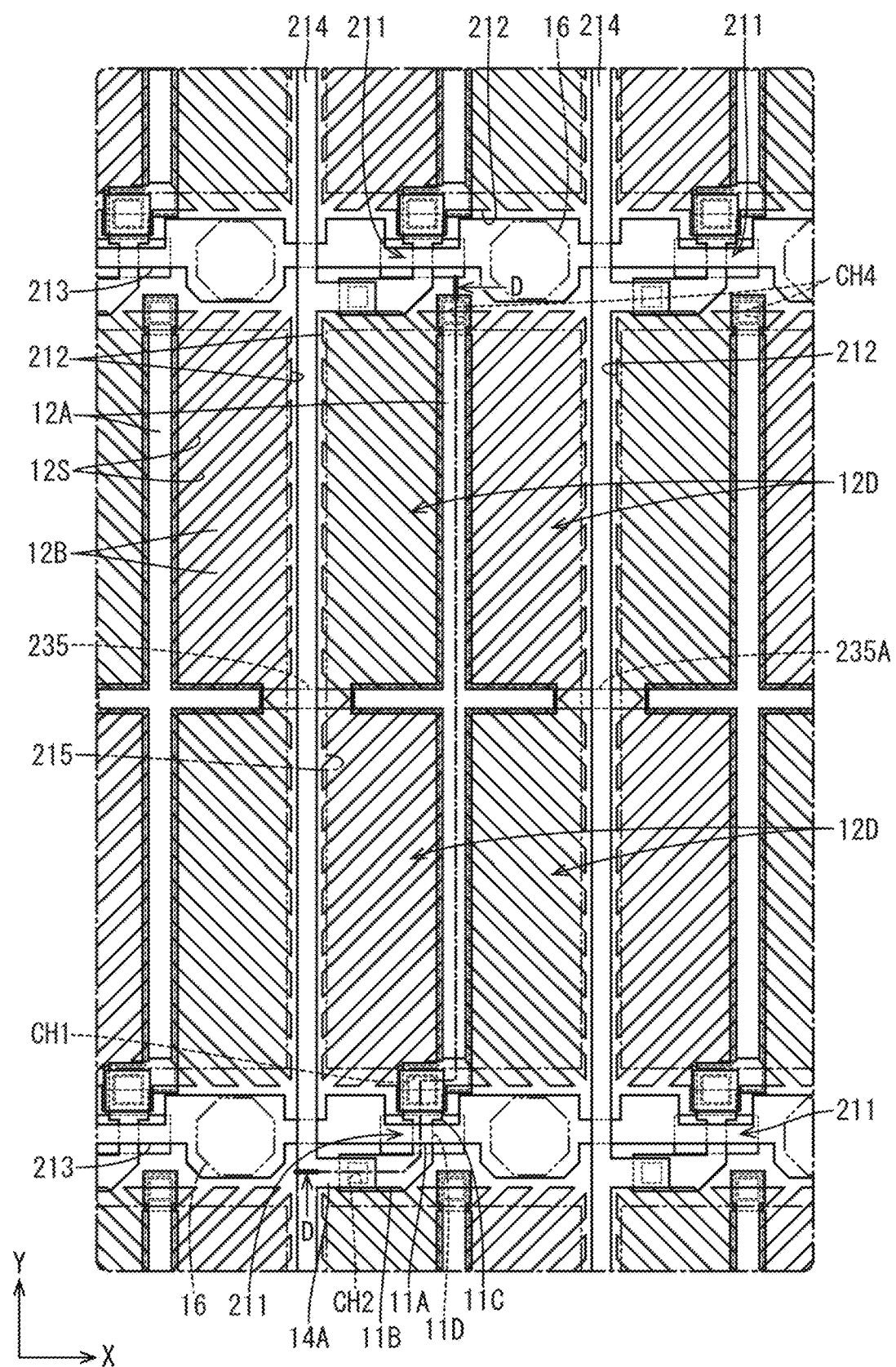
FIG. 12 is a plan view illustrating arrangement of pixels in an array substrate according to a third embodiment.
Figure 13:
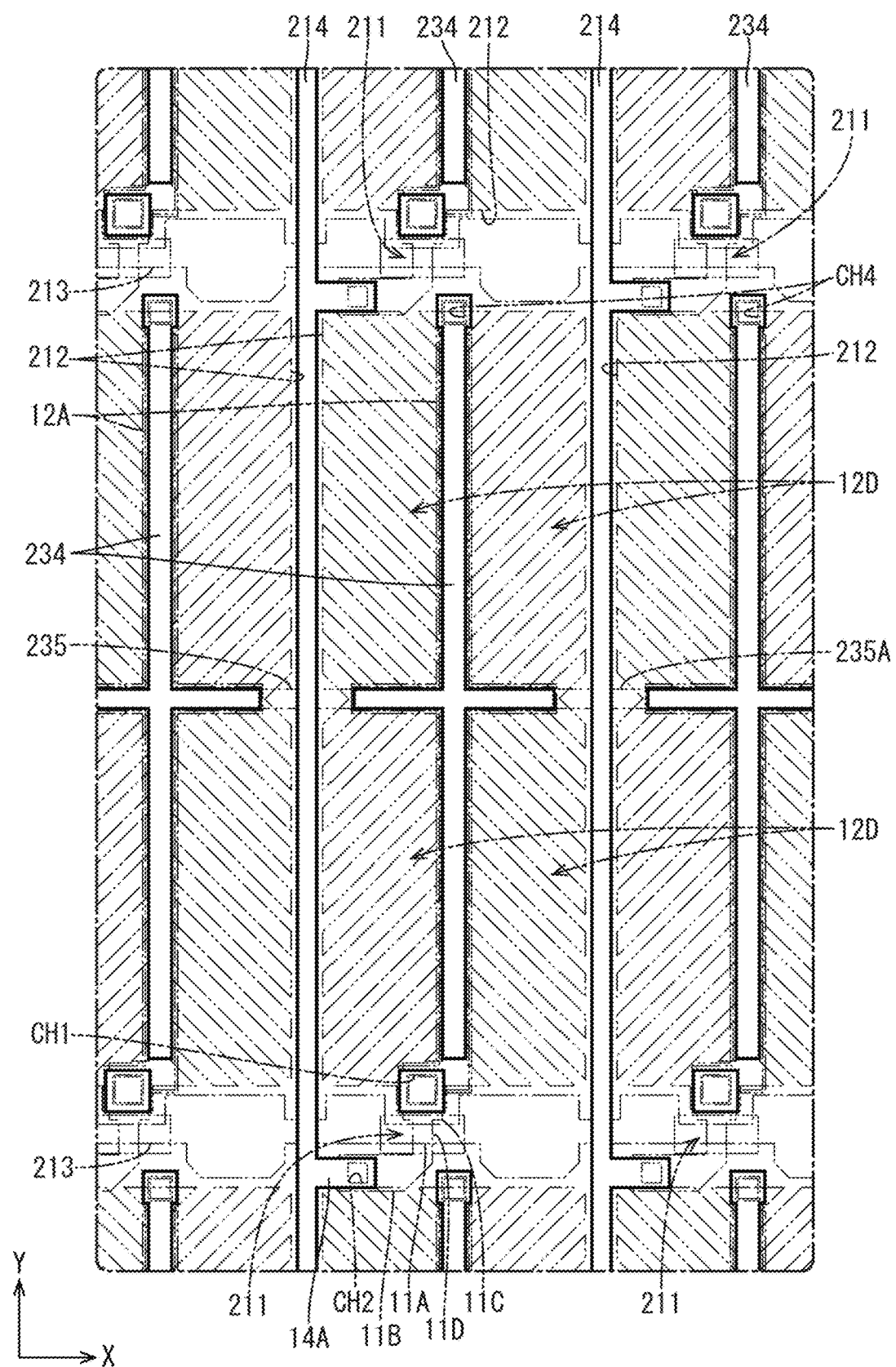
FIG. 13 is a plan view mainly illustrating a pattern of a third metal film included in the array substrate.

As illustrated in FIG. 12, the gate lines 213 and pixel electrodes 212 in this embodiment are alternately arranged in the Y-axis direction. As illustrated in FIG. 13, the source lines 214 and the pixel electrodes 212 are alternately arranged in the X-axis direction. Each of the TFTs 211 is disposed between the pixel electrodes 212 that are adjacent to each other in the Y-axis direction. In such a configuration, the scan signals are supplied in sequence to the gate lines 213 arranged in the Y-axis direction to turn on the TFTs 211 arranged in the Y-axis direction in sequence. Furthermore, the image signals are supplied to the source lines 214 arranged in the X-axis direction to charge the pixel electrodes 212 arranged in the X-axis direction and the Y-axis direction to the different potentials.

Figure 14:
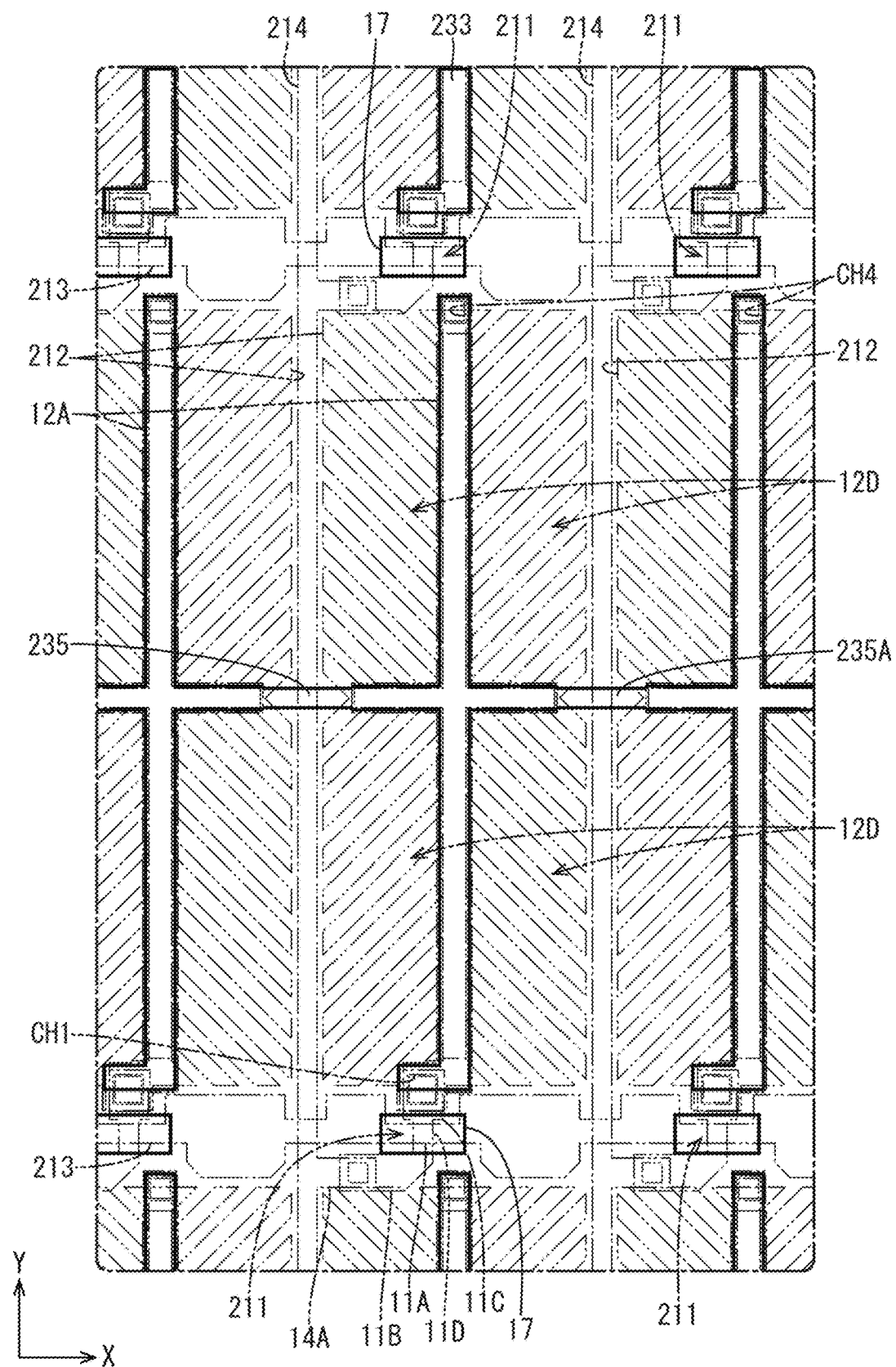
FIG. 14 is a plan view mainly illustrating a pattern of a first metal film included in an array substrate.

Because the TFTs 211, the gate lines 213, and the source lines 214 are arranged as described above, there is not enough spaces for the lines other than the source lines 214 between the pixel electrodes 212 that are adjacent to each other in the X-axis direction. As illustrated in FIG. 14, capacitance lines 235 in this embodiment only include first capacitance lines 235A. The first capacitance lines 235A are coupled to first capacitance forming portions 233 that are adjacent to each other in the X-axis direction. The first capacitance forming portions 233 and the first capacitance lines 235A are alternately arranged in the X-axis direction. The number of the first capacitance lines 235A arranged in the X-axis direction is equal to the number of the first capacitance forming portions 233 (the pixel electrodes 212) arranged in the X-axis direction minus 1. The first capacitance forming portions 233 arranged in the X-axis direction are connected to each other via the first capacitance lines 235A via the first capacitance lines 235A therebetween. The first capacitance forming portions 233 arranged in the X-axis direction are not directly connected. The first capacitance lines 235A extend in the X-axis direction not to cross the gate lines 213. Therefore, parasitic capacitances are less likely to appear between the first capacitance lines 235A and the gate lines 213. The standard deviation in distribution regarding resistances of the first capacitance forming portions 233 can be further reduced. According to the configuration, the potentials are further stably held at the pixel electrodes 212.

Figure 15:
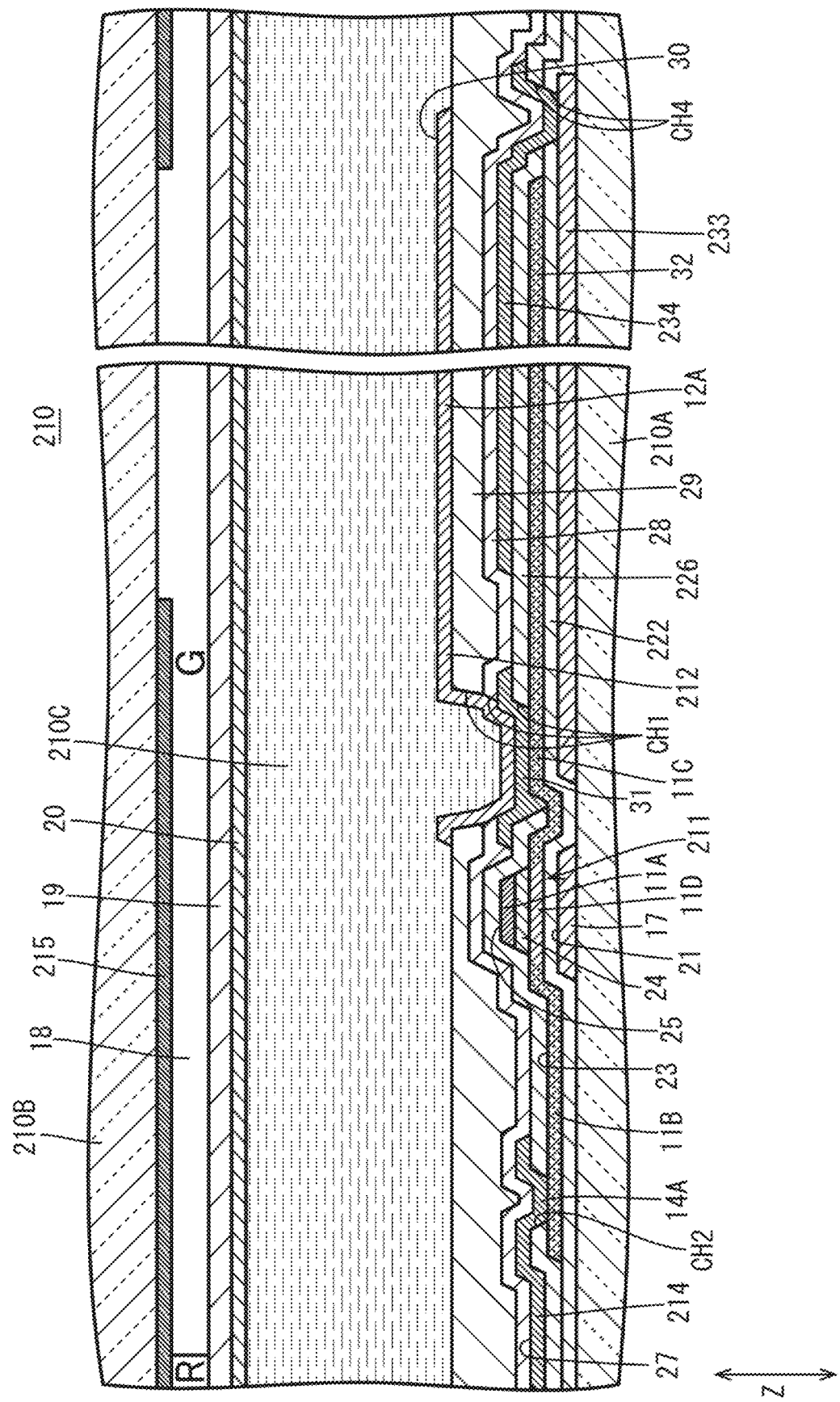
FIG. 15 is a cross-sectional view of a liquid crystal panel along line D-D in FIG. 12.

In this embodiment, the source lines 214 and the pixel electrodes 212 are alternately arranged as described earlier. Therefore, the connecting portions 36 (see FIG. 7) in the first embodiment are not provided. In this embodiment, the connecting structure for connecting the first capacitance forming portions 233 to second capacitance forming portions 234 is different from that of the first embodiment. Specifically, as illustrated in FIGS. 13 to 15, sections of the first capacitance forming portions 233 and the second capacitance forming portions 234 overlapping each other extend in the Y-axis direction. Ends of the sections on an opposite side from the TFTs 211 are connected to each other via contact holes CH4 drilled through a first insulator 222 and a third insulator 226 that are disposed between the first capacitance forming portions 233 and the second capacitance forming portions 234. The contact holes CH4 are located to correspond to sections of the first capacitance forming portions 233 and the second capacitance forming portions 234 the closest to the gate lines 213 in the Y-axis direction. Each of the contact holes CH4 is located in the middle of the corresponding pixel electrode 212 in the X-axis direction and at an end of the corresponding pixel electrode 212 in the Y-axis direction. In edge areas of the pixel electrodes 212 (including sections closer to the gate lines 213), it is difficult to properly control the orientation of the liquid crystal molecules in the liquid crystal layer 210C. Therefore, a black matrix 215 of a CF substrate 210B is disposed to overlap the edge areas. Light passed through middle portions of the pixel electrodes 212 and holes in the black matrix 215 contributes to image display. Light passed through the edge areas is blocked by the black matrix 215 and thus the light does not contribute to the image display. The contact holes CH4 are located at positions overlapping parts of the edge areas of the pixel electrodes 212 so that the contact holes CH4 do not affect the image display. Even if disturbances occur in orientation of the liquid crystal molecules around the contact holes CH4, the disturbances are less likely to affect the image display.

In this embodiment, the gate lines 213 and the pixel electrodes 212 are alternately arranged in the second direction. The gate lines 213 extend in the first direction. The source lines 214 and the pixel electrodes 212 are alternately arranged in the first direction. The source lines 214 extend in the second direction. Each of the TFTs 211 is sandwiched between the pixel electrodes 212 that are adjacent to each other in the first direction or the second direction. The capacitance lines 235 include only the first capacitance lines 235A. The source lines 214 and the pixel electrodes 212 are alternately arranged in the second direction. The gate lines 213 and the pixel electrodes 212 are alternately arranged in the first direction. Each of the TFTs 211 is sandwiched between the pixel electrodes 212 that are adjacent to each other in the first direction or the second direction. According to the configuration, the pixel electrodes 212 arranged in the first direction and the second direction can be charged to the different potentials. The capacitance lines 235 include only the first capacitance lines 235A coupled to the first capacitance forming portions 233 that are adjacent in the first direction. The first capacitance lines 235A do not cross the gate lines 213. Parasitic capacitances are less likely to be present between the first capacitance lines 235A and the gate lines 213. Therefore, the standard deviation in distribution regarding resistances of the first capacitance forming portions 233 can be further reduced. According to the configuration, the potentials are further stably held at the pixel electrodes 212.

Other Embodiments

The technology described herein is not limited to the embodiments described above and illustrated by the drawings. For example, the following embodiments will be included in the technical scope of the technology described herein.

(1) In the first embodiment and the second embodiment, the second capacitance lines are prepared from the first metal film and the second capacitance lines are prepared from the third metal film, respectively. However, some of the second capacitance lines may be prepared from the first metal film and the rest of the second capacitance lines may be prepared from the third metal film. In this configuration, the second capacitance lines prepared from the first metal film and the second capacitance lines prepared from the third metal film cross the gate lines and thus parasitic capacitances may increase. Therefore, it is preferable to increase the thicknesses of the first insulator and the third insulator disposed between the second capacitance lines and the gate.

(2) In each of the above embodiments, the electrode connecting portions, the first capacitance forming portions, and the second capacitance forming portions are disposed to overlap about the entire areas of the borders between the domains of the pixel electrodes. However, the electrode connecting portions, the first capacitance forming portions, and the second capacitance forming portions may be disposed to overlap parts of the borders between the domains of the pixel electrodes. For example, the electrode connecting portions, the first capacitance forming portions, and the second capacitance forming portions may include only the sections that extend in the X-axis direction and may not include the sections that extend in the Y-axis direction.

(3) In each of the above embodiments, the electrode connecting portions are prepared from the resistance reduced sections of the semiconductor film. The electrode connecting portions may be prepared from the conductive film other than the semiconductor film. For example, a fourth metal film may be formed between the third metal film and the transparent electrode film with an insulator between the fourth metal film and the third metal film and an insulator between the fourth metal film and the transparent electrode film. Then, the electrode connecting portions may be prepared from the third metal film and the second capacitance forming portions may be prepared from the fourth metal film.

(4) In each of the first to the third embodiments, each of the first capacitance lines and each of the second capacitance lines linearly extends in the X-axis direction or the Y-axis direction. However, at least one of each first capacitance line and each the second capacitance line may bend. If appropriate, at least one of each first capacitance line and each second capacitance line may be in zigzags.

(5) In each of the above embodiments, the top gate type TFTs including the light blocking portions separately from the gate electrodes are used. However, the top gate type TFTs may have configurations not including the light blocking portions separately from the gate electrodes. In such configuration, the source lines may be prepared from the first metal film and the capacitance forming portions, the first capacitance lines, and the second capacitance lines may be prepared from the third metal film.

(6) In each of the above embodiments, the top gate type TFTs including the gate electrodes disposed in the upper layer to overlap the channel regions are used. However, bottom gate type TFTs including gate electrodes disposed in a lower layer to overlap the channel regions may be used. In such a configuration, the gate electrodes and the first capacitance forming portions may be prepared from the first metal film, the source regions, the drain regions, and the channel regions of the TFTs and the electrode connecting portions may be prepared from the semiconductor film, and the source lines and the second capacitance forming portions may be prepared from the second metal film.

(7) In each of the above embodiments, the light blocking portions of the TFTs do not contact the gate electrodes. Similar to each of the TFTs in the fourth embodiment, the light blocking portion may be connected to the gate electrode and configured as a double-gate TFT.

(8) In each of the above embodiments, each of the resistance reduced sections has the cross shape similar to that of the capacitance forming portion in a plan view. However, a plan-view shape of the resistance reduced section may be different from the plan-view shape of the capacitance forming portion. Because the resistance reduced section is prepared from the semiconductor film and has the light transmissivity, the aperture ratio of the pixels is less likely to be reduced even if the area of the resistance reduced sections is larger than the area of the capacitance forming portions.

(9) In each of the above embodiments, each of the electrodes includes four domains. However, each of the electrodes may include more than four domains. In such a configuration, a plan-view shape of borders of the domains is different. Therefore, the plan-view shape of the capacitance forming portion or the resistance reduced portions may be altered from the cross shape.

(10) In each of the above embodiments, the drain region of each of the TFTs and the corresponding pixel electrode are indirectly connected to each other via the drain connecting portion. However, the drain connecting portion may be omitted, that is, the drain region and the pixel electrode may be directly connected to each other.

(11) In each of the above embodiments, the liquid crystal material included in the liquid crystal layer is the negative liquid crystal material having the negative dielectric constant anisotropy. However, a positive liquid crystal material having positive dielectric constant anisotropy may be used.

(12) In each of the above embodiments, the vertical alignment films are used. However, horizontal alignment films may be used.

(13) The two-dimensional arrangement of the TFTs may be altered from those in each of the above embodiments. For example, each of the TFTs may be sandwiched between the pixel electrodes adjacent to each other in the X-axis direction.

(14) In each of the above embodiments, the line width of each of the gate lines alters at points. However, the line width may be substantially constant.

(15) The liquid crystal panel may be configured to operate in TN display mode, FFS display mode, or IPS display mode other than the display mode in the first to the third embodiment.

(16) In each of the above embodiments, the liquid crystal display device including the transmissive-type liquid crystal panel is provided as an example. However, a liquid crystal display device including a reflective-type liquid crystal panel or a semitransmissive-type liquid crystal panel may be used.

(17) In each of the above embodiments, the semiconductor film made of the oxide semiconductor is provided. However, the semiconductor film may be made of amorphous silicon or polysilicon (LTPS).

(18) In each of the above embodiments, the array substrate included in the liquid crystal panel is provided as an example. However, array substrates included in other types of display panels (e.g., organic EL display panels, microcapsule electrophoretic display (EPD) panels) may be provided.

The invention claimed is:

1. An array substrate comprising:
   at least one electrode;
   at least one first capacitance forming portion disposed to overlap the at least one electrode via an insulator;
   at least one electrode connecting portion connected to the at least one electrode and disposed between the at least one electrode and the at least one first capacitance forming portion to overlap the at least one electrode and the at least one first capacitance forming portion via insulators, respectively;
   at least one second capacitance forming portion connected to the at least one first capacitance forming portion and disposed between the at least one electrode and the at least one electrode connecting portion to overlap the at least one electrode and the at least one electrode connecting portion via insulators, respectively;
   a switching component including:
      a gate electrode;
      a channel region disposed to overlap the gate electrode from a lower layer side via a gate insulator, the channel region including a section of a semiconductor film;
      a source region connected to a first end of the channel region; and
      a drain region connected to a second end of the channel region and the at least one electrode; and
   a light blocking portion disposed to overlap the channel region from a lower layer side via a lower layer-side insulator, the light blocking portion including a section of a conductive film, wherein
   the light blocking portion includes a section of the conductive film including a section configured as the at least one first capacitance forming portion.

2. The array substrate according to claim 1, wherein the at least one electrode connecting portion is prepared by reducing a resistance of a section of the semiconductor film.

3. The array substrate according to claim 2, further comprising a line connected to a section of the source region on an opposite side from the channel region and including a section of a conductive film disposed to overlap the semiconductor film from an upper layer side via an insulator, wherein
   the at least one second capacitance forming portion includes a section of the conductive film including a section configured as the line.

4. The array substrate according to claim 3, wherein
   at least the drain region includes a section of the semiconductor film,
   the at least one electrode includes a section of a transparent electrode film disposed in a layer upper than a conductive film via an insulator, the conductive film including sections configured as the line and the at least one second capacitance forming portion, and
   the insulator disposed between the transparent electrode film and the semiconductor film includes a contact hole at a position at which the at least one electrode and the drain region overlap each other.

5. The array substrate according to claim 1, wherein
   the at least one electrode includes domains, and
   the at least one first capacitance forming portion and the at least one second capacitance forming portion are disposed to overlap borders between the adjacent domains of the at least one electrode.

6. A display device comprising:
   the array substrate according to claim 3; and
   an opposed substrate opposed to the array substrate.

7. An array substrate comprising:
   at least one electrode;
   at least one first capacitance forming portion disposed to overlap the at least one electrode via an insulator;
   at least one electrode connecting portion connected to the at least one electrode and disposed between the at least one electrode and the at least one first capacitance forming portion to overlap the at least one electrode and the at least one first capacitance forming portion via insulators, respectively;
   at least one second capacitance forming portion connected to the at least one first capacitance forming portion and disposed between the at least one electrode and the at least one electrode connecting portion to overlap the at least one electrode and the at least one electrode connecting portion via insulators, respectively;
   the at least one electrode includes electrodes,
   the at least one first capacitance forming portion includes first capacitance forming portions,
   the at least one electrode connecting portion includes electrode connecting portions,
   the at least one second capacitance forming portion includes second capacitance forming portions, and
   the array substrate further comprises at least one capacitance line coupled to at least the adjacent first capacitance forming portions or the adjacent second capacitance forming portions.

8. The array substrate according to claim 7, wherein
   the electrodes, the electrode connecting portions, the first capacitance forming portions, and the second capacitance forming portions are arranged in a first direction and a second direction that crosses the first direction,
   the array substrate further comprises:
   at least one first line disposed between the electrodes adjacent in the second direction, the at least one first line extending in the first direction;
   at least one second line disposed between the electrode adjacent in the first direction, the at least one second line extending in the second direction; and
   at least one switching component including:
      a gate electrode connected to the at least one first line;
      a source region connected to the at least one second line;
      a drain region connected to the at least one electrode; and
      a channel region including a first end connected to the source region and a second end connected to the drain region and disposed to overlap the gate electrode via the gate insulator, the channel region including a section of a semiconductor film,
   the at least one first capacitance forming portion includes a section of a conductive film disposed in a layer lower than the semiconductor film via a lower layer-side insulator, and
   the at least one capacitance line includes a first capacitance line coupled to the at least one first capacitance forming portion adjacent in the first direction and including a section of a conductive film including a section configured as the at least one first capacitance forming portion.

9. The array substrate according to claim 8, wherein
   the at least one second line includes second lines arranged at intervals such that two of the electrodes are sandwiched therebetween, the at least one first line includes first lines arranged such that every two of the first lines are sandwiched between the electrodes that are adjacent in the second direction, the at least one switching component includes at least two switching components connected to two of the first lines and the electrodes adjacent to the two of the first lines, the at least one capacitance line includes second capacitance lines coupled to at least the at least one first capacitance forming portion adjacent in the second direction or the at least one second capacitance forming portion adjacent in the second direction and sandwiched between two of the electrodes that are sandwiched between the second lines adjacent to each other.

10. The array substrate according to claim 9, further comprising a connecting portion coupled to the second capacitance forming portions that are adjacent to each other with the at least one second capacitance line therebetween and including a section of a conductive film including a section configured as the at least one second capacitance forming portion.

11. The array substrate according to claim 10, wherein the connecting portion is disposed to overlap the at least one first capacitance line via an insulator and connected to the at least one first capacitance line via a contact hole drilled through the insulator disposed between the connecting portion and the at least one first capacitance line.

12. The array substrate according to claim 9, wherein the at least one second capacitance line is coupled to the at least one first capacitance forming portion adjacent in the second direction and including a section of a conductive film including a section configured as the first capacitance forming portion.

13. The array substrate according to claim 9, wherein the at least one second capacitance line is coupled to the at least one second capacitance forming portion adjacent in the second direction and including a section of a conductive film including a section configured as the second capacitance forming portion.

14. The array substrate according to claim 8, wherein
the first lines and the electrodes are alternately arranged in the second direction, the first lines extending in the first direction,
the second lines and the electrodes are alternately arranged in the first direction, the second lines extending in the second direction,
each of the switching components is disposed between the electrodes adjacent in the first direction or the second direction, and
the at least one capacitance line includes only the first capacitance line.

15. The array substrate according to claim 7, wherein
the at least one electrode includes domains, and
the at least one first capacitance forming portion and the at least one second capacitance forming portion are disposed to overlap borders between the adjacent domains of the at least one electrode.

16. A display device comprising:
the array substrate according to claim 7; and
an opposed substrate opposed to the array substrate.

* * * * *